(12) United States Patent
Saji et al.

(10) Patent No.: US 11,088,673 B2
(45) Date of Patent: Aug. 10, 2021

(54) COMPOSITE FILTER DEVICE, HIGH-FREQUENCY FRONT END CIRCUIT, AND COMMUNICATION DEVICE

(71) Applicant: Murata Manufacturing Co., Ltd., Nagaokakyo (JP)

(72) Inventors: Mari Saji, Nagaokakyo (JP); Junpei Yasuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 173 days.

(21) Appl. No.: 16/125,885

(22) Filed: Sep. 10, 2018

(65) Prior Publication Data

US 2019/0007030 A1 Jan. 3, 2019

Related U.S. Application Data

(63) Continuation of application No. PCT/JP2017/008559, filed on Mar. 3, 2017.

(30) Foreign Application Priority Data

Mar. 31, 2016 (JP) .............................. JP2016-070106

(51) Int. Cl.
*H03H 9/64* (2006.01)
*H03H 9/72* (2006.01)
(Continued)

(52) U.S. Cl.
CPC ...... *H03H 9/6406* (2013.01); *H03H 9/02559* (2013.01); *H03H 9/02637* (2013.01);
(Continued)

(58) Field of Classification Search
CPC ................................................ H03H 9/54–76
See application file for complete search history.

(56) References Cited

U.S. PATENT DOCUMENTS 5,965,969 A 10/1999 Kadota
7,446,629 B2 * 11/2008 Nakamura ........... H03H 9/0038
333/133
(Continued)

FOREIGN PATENT DOCUMENTS

JP 60-169209 A 9/1985
JP 09-205337 A 8/1997
(Continued)

OTHER PUBLICATIONS

Wannstrom, "Carrier Aggregation Explained", https://www.3gpp.org/technologies/keywords-acronyms/101-carrier-aggregation-explained, 2013.*
(Continued)

*Primary Examiner* — Dean O Takaoka
*Assistant Examiner* — Alan Wong
(74) *Attorney, Agent, or Firm* — Keating & Bennett, LLP

(57) ABSTRACT

A composite filter device includes an antenna common terminal, a first band pass filter having a first pass band, and a second band pass filter having a second pass band located at higher frequencies than the first pass band. The first band pass filter includes an elastic wave resonator. The elastic wave resonator includes a LiNbO$_3$ substrate, an IDT electrode on the LiNbO$_3$ substrate, and a dielectric film that covers the IDT electrode and includes a silicon oxide as a main component. When f1' is the frequency of a Sezawa wave of the first band pass filter and f2 is the center frequency of the second pass band, f1' is located at a different position from f2.

20 Claims, 8 Drawing Sheets

(51) Int. Cl.
  *H03H 9/145*  (2006.01)
  *H03H 9/02*  (2006.01)
  *H03H 9/25*  (2006.01)
  *H01L 41/047*  (2006.01)
  *H01Q 1/50*  (2006.01)
  *H03H 7/38*  (2006.01)

(52) U.S. Cl.
  CPC ........ *H03H 9/02834* (2013.01); *H03H 9/145* (2013.01); *H03H 9/14541* (2013.01); *H03H 9/25* (2013.01); *H03H 9/6436* (2013.01); *H03H 9/6483* (2013.01); *H03H 9/725* (2013.01); *H01L 41/0477* (2013.01); *H01Q 1/50* (2013.01); *H03H 7/38* (2013.01)

(56) References Cited

U.S. PATENT DOCUMENTS

| | | | | |
|---|---|---|---|---|
| 8,880,096 | B2* | 11/2014 | Rousu | G01S 19/235 |
| | | | | 455/456.1 |
| 9,337,990 | B2* | 5/2016 | Narahashi | H04L 5/1461 |
| 9,467,104 | B2* | 10/2016 | Xu | H03F 3/193 |
| 2007/0210676 | A1 | 9/2007 | Matsuda et al. | |
| 2011/0095845 | A1* | 4/2011 | Fujiwara | H03H 9/725 |
| | | | | 333/133 |
| 2013/0113576 | A1 | 5/2013 | Inoue et al. | |
| 2013/0300519 | A1* | 11/2013 | Tamasaki | H03H 9/02834 |
| | | | | 333/133 |
| 2015/0295596 | A1 | 10/2015 | Wloczysiak et al. | |
| 2015/0341076 | A1 | 11/2015 | Uejima | |
| 2016/0197643 | A1 | 7/2016 | Uejima | |

FOREIGN PATENT DOCUMENTS

| | | |
|---|---|---|
| JP | 2012-175315 A | 9/2012 |
| JP | 2013-118611 A | 6/2013 |
| JP | 2013-138333 A | 7/2013 |
| JP | 2015-204629 A | 11/2015 |
| KR | 10-2007-0092110 A | 9/2007 |
| KR | 10-2013-0103607 A | 9/2013 |
| WO | 2009/147787 A1 | 12/2009 |
| WO | 2012/098816 A1 | 7/2012 |
| WO | 2014/125980 A1 | 8/2014 |
| WO | 2015/041125 A1 | 3/2015 |

OTHER PUBLICATIONS

Shikata et al., "Simulation of Characteristics of a LiNbO3/Diamond Surface Acoustic Wave", IEEE transactions on Ultrasonics, Ferroelectrics, and Frequency Control, vol. 51, No. 10, Oct. 2004 (Year: 2004).*
Official Communication issued in International Patent Application No. PCT/JP2017/008559, dated May 23, 2017.

* cited by examiner

COMPOSITE FILTER DEVICE, HIGH-FREQUENCY FRONT END CIRCUIT, AND COMMUNICATION DEVICE

CROSS REFERENCE TO RELATED APPLICATIONS

This application claims the benefit of priority to Japanese Patent Application No. 2016-070106 filed on Mar. 31, 2016 and is a Continuation Application of PCT Application No. PCT/JP2017/008559 filed on Mar. 3, 2017. The entire contents of each application are hereby incorporated herein by reference.

BACKGROUND OF THE INVENTION

1. Field of the Invention

The present invention relates to a composite filter device in which a plurality of band pass filters are connected to an antenna terminal, to a high-frequency front end circuit that includes the composite filter device, and to a communication device.

2. Description of the Related Art

Heretofore, composite filter devices in which a plurality of band pass filters are connected to an antenna terminal have been used.

In a duplexer disclosed in Japanese Unexamined Patent Application Publication No. 2012-175315, a transmission filter and a reception filter are connected to an antenna terminal. The transmission filter utilizes Rayleigh waves that propagate along a $LiNbO_3$ substrate. The transmission filter is formed of a ladder filter that includes a plurality of elastic wave resonators. A $SiO_2$ film is provided so as to cover the IDT electrodes of the elastic wave resonators.

Japanese Unexamined Patent Application Publication No. 2015-204629 discloses a carrier aggregation circuit in which first and second filters are connected to an antenna terminal. The first filter has a first frequency band. The second filter has a second frequency band that is different from the first frequency band. The first and second filters each define a portion of a duplexer.

Although there is no problem when a band pass filter of the related art that utilizes Rayleigh waves such as that disclosed in Japanese Unexamined Patent Application Publication No. 2012-175315 is used in a duplexer, when the band pass filter disclosed in Japanese Unexamined Patent Application Publication No. 2012-175315 is used in a carrier aggregation circuit such as that disclosed in Japanese Unexamined Patent Application Publication No. 2015-204629, there is a problem in that Sezawa waves, which are higher mode Rayleigh waves, appear around the frequency of the Rayleigh waves and around a frequency 1.2 times the frequency of the Rayleigh waves. This response constitutes unwanted waves, and has an adverse effect on other filter characteristics. Specifically, in the case in which two filters having different frequency bands are connected to an antenna terminal, the Sezawa wave response of one filter having the lower frequency band appears inside the pass band of the other filter having the higher frequency band, and as a result the insertion loss of the other filter having the higher frequency band is degraded. In particular, if the Sezawa wave response coincides with the center frequency of the frequency band of the other filter having the higher frequency band, there is significant degradation of the insertion loss of the other filter having the higher frequency band.

SUMMARY OF THE INVENTION

Preferred embodiments of the present invention provide composite filter devices in each of which a Sezawa wave of a band pass filter that utilizes Rayleigh waves is unlikely to adversely affect a band pass filter having a higher frequency band than the band pass filter that utilizes Rayleigh waves, high-frequency front end circuits that each include the composite filter device, and communication devices.

A composite filter device according to a preferred embodiment of the present invention is used in carrier aggregation (CA). The composite filter device includes an antenna common terminal that is connected to an antenna; and a plurality of band pass filters that are connected to the antenna common terminal and have different pass bands from each other. The plurality of band pass filters include a first band pass filter that has a first pass band, and a second band pass filter that is connected to the antenna common terminal and has a second pass band located at higher frequencies than the first band pass filter. The first band pass filter includes an elastic wave resonator. The elastic wave resonator includes a $LiNbO_3$ substrate, an IDT electrode that is provided on the $LiNbO_3$ substrate, and a dielectric film that covers the IDT electrode on the $LiNbO_3$ substrate and includes a silicon oxide as a main component. The elastic wave resonator utilizes Rayleigh waves that propagate along the $LiNbO_3$ substrate. When f1' is a frequency of a Sezawa wave of the first band pass filter and f2 is the center frequency of the second pass band, f1' is located at a different position from f2.

In a composite filter device according to a preferred embodiment of the present invention, the IDT electrode includes a first metal film including one metal from among Pt, Mo, and Cu as a main component, and when f1 is a center frequency of the first pass band, y is f1'/f1, x is a film thickness of the dielectric film, and the first metal film is made of a metal and has a film thickness as listed in Table 1 below, y has a different value from f2/f1 in a formula illustrated in Table 1 below. In below Table 1, x4 represents x to the power of 4, x3 represents x to the power of 3, and x2 represents x to the power of 2.

TABLE 1

| NORMALIZED FILM THICKNESS OF FIRST METAL FILM | |
|---|---|
| $0.25\% < Pt \leq 0.75\%$ | y = 0.00000096 x4 − 0.00011979 x3 + 0.00535955 x2 − 0.10212558 x + 1.91148793 |
| $0.75\% < Pt \leq 1.25\%$ | y = 0.00000091 x4 − 0.00011525 x3 + 0.00522036 x2 − 0.10069362 x + 1.93521887 |
| $1.25\% < Pt \leq 1.75\%$ | y = 0.00000103 x4 − 0.00013182 x3 + 0.00602995 x2 − 0.11792508 x + 2.09489847 |
| $1.75\% < Pt \leq 2.25\%$ | y = 0.00000109 x4 − 0.00014124 x3 + 0.00650460 x2 − 0.12836964 x + 2.20470460 |
| $2.25\% < Pt \leq 2.75\%$ | y = 0.00000113 x4 − 0.00014692 x3 + 0.00680623 x2 − 0.13536545 x + 2.28964825 |
| $2.75\% < Pt \leq 3.25\%$ | y = 0.00000111 x4 − 0.00014601 x3 + 0.00681451 x2 − 0.13665429 x + 2.33392938 |
| $3.25\% < Pt \leq 3.75\%$ | y = 0.00000119 x4 − 0.00015728 x3 + 0.00737777 x2 − 0.14901122 x + 2.45977087 |
| $3.75\% < Pt \leq 4.25\%$ | y = 0.00000123 x4 − 0.00016379 x3 + 0.00772873 x2 − 0.15723896 x + 2.55622092 |
| $4.25\% < Pt \leq 4.75\%$ | y = 0.00000121 x4 − 0.00016214 x3 + 0.00769286 x2 − 0.15751557 x + 2.59312937 |
| $4.75\% < Pt \leq 5.25\%$ | y = 0.00000174 x4 − 0.00022691 x3 + |

TABLE 1-continued

| NORMALIZED FILM THICKNESS OF FIRST METAL FILM | |
|---|---|
| $5.25\% < \text{Pt} \leq 5.75\%$ | $0.01058009\ x2 - 0.21389115\ x + 3.02814932$<br>$y = 0.00000247\ x4 - 0.00032401\ x3 +$<br>$0.01528948\ x2 - 0.31238987\ x + 3.79970631$ |
| $5.75\% < \text{Pt} \leq 6.25\%$ | $y = 0.00000196\ x4 - 0.00026015\ x3 +$<br>$0.01236721\ x2 - 0.25465724\ x + 3.40977449$ |
| $6.25\% < \text{Pt} \leq 6.75\%$ | $y = 0.00000167\ x4 - 0.00022169\ x3 +$<br>$0.01050080\ x2 - 0.21577253\ x + 3.14097300$ |
| $6.75\% < \text{Pt} \leq 7.25\%$ | $y = 0.00000167\ x4 - 0.00022176\ x3 +$<br>$0.01051467\ x2 - 0.21651968\ x + 3.17671777$ |
| $7.25\% < \text{Pt} \leq 7.75\%$ | $y = 0.00000166\ x4 - 0.00022134\ x3 +$<br>$0.01050380\ x2 - 0.21672919\ x + 3.20799513$ |
| $7.75\% < \text{Pt} \leq 8.25\%$ | $y = 0.00000150\ x4 - 0.00020368\ x3 +$<br>$0.00980313\ x2 - 0.20524827\ x + 3.16834265$ |
| $8.25\% < \text{Pt} \leq 8.75\%$ | $y = 0.00000085\ x4 - 0.00012074\ x3 +$<br>$0.00592600\ x2 - 0.12681719\ x + 2.61288002$ |
| $8.75\% < \text{Pt} \leq 9.25\%$ | $y = 0.00000111\ x4 - 0.00015724\ x3 +$<br>$0.00741930\ x2 - 0.15748992x + 2.87039438$ |
| $9.25\% < \text{Pt} \leq 9.75\%$ | $y = 0.00000105\ x4 - 0.00014596\ x3 +$<br>$0.00710645\ x2 - 0.15151217\ x + 2.85463183$ |
| $9.75\% < \text{Pt} \leq 10.25\%$ | $y = 0.00000100\ x4 - 0.00013894\ x3 +$<br>$0.00678214\ x2 - 0.14528844\ x + 2.83677788$ |
| $10.25\% < \text{Pt} \leq 10.75\%$ | $y = 0.00000094\ x4 - 0.00013176\ x3 +$<br>$0.00644924\ x2 - 0.13888705\ x + 2.81740252$ |
| $10.75\% < \text{Pt} \leq 11.25\%$ | $y = 0.00000057\ x4 - 0.00008628\ x3 +$<br>$0.00439990\ x2 - 0.09911499\ x + 2.55984107$ |
| $0.5\% < \text{Mo} \leq 1.5\%$ | $y = 0.00000086\ x4 - 0.00011477\ x3 +$<br>$0.00547211\ x2 - 0.11082241\ x + 2.01030202$ |
| $1.5\% < \text{Mo} \leq 2.5\%$ | $y = 0.00000069\ x4 - 0.00009656\ x3 +$<br>$0.00481601\ x2 - 0.10151017\ x + 1.98701155$ |
| $2.5\% < \text{Mo} \leq 3.5\%$ | $y = 0.00000031\ x4 - 0.00005031\ x3 +$<br>$0.00275675\ x2 - 0.06203059\ x + 1.72906604$ |
| $3.5\% < \text{Mo} \leq 4.5\%$ | $y = -0.00000013\ x4 + 0.00000558\ x3 +$<br>$0.00017119\ x2 - 0.01044443\ x + 1.37200658$ |
| $4.5\% < \text{Mo} \leq 5.5\%$ | $y = -0.00000051\ x4 + 0.00005558\ x3 -$<br>$0.00219606\ x2 + 0.03780068\ x + 1.03279022$ |
| $5.5\% < \text{Mo} \leq 6.5\%$ | $y = -0.00000080\ x4 + 0.00009310\ x3 -$<br>$0.00401794\ x2 + 0.07571679\ x + 0.76564163$ |
| $6.5\% < \text{Mo} \leq 7.5\%$ | $y = -0.00000087\ x4 + 0.00010545\ x3 -$<br>$0.00468570\ x2 + 0.09061546\ x + 0.66729105$ |
| $7.5\% < \text{Mo} \leq 8.5\%$ | $y = -0.00000082\ x4 + 0.00010128\ x3 -$<br>$0.00457852\ x2 + 0.08976261\ x + 0.68639844$ |
| $8.5\% < \text{Mo} \leq 9.5\%$ | $y = -0.00000060\ x4 + 0.00007497\ x3 -$<br>$0.00342455\ x2 + 0.06742932\ x + 0.86713651$ |
| $10.5\% < \text{Mo} \leq 11.5\%$ | $y = -0.00000017\ x4 + 0.00002091\ x3 -$<br>$0.00096441\ x2 + 0.01844249\ x + 1.24807166$ |
| $11.5\% < \text{Mo} \leq 12.5\%$ | $y = -0.00000015\ x4 + 0.00001931\ x3 -$<br>$0.00090997\ x2 + 0.01753506\ x + 1.27433165$ |
| $12.5\% < \text{Mo} \leq 13.5\%$ | $y = -0.00000006\ x4 + 0.00000784\ x3 -$<br>$0.00039201\ x2 + 0.00714081\ x + 1.37199243$ |
| $13.5\% < \text{Mo} \leq 14.5\%$ | $y = -0.00000003\ x4 + 0.00000446\ x3 -$<br>$0.00024129\ x2 + 0.00395507\ x + 1.41813718$ |
| $14.5\% < \text{Mo} \leq 15.5\%$ | $y = -0.00000003\ x4 + 0.00000459\ x3 -$<br>$0.00023227\ x2 + 0.00312729\ x + 1.45148162$ |
| $15.5\% < \text{Mo} \leq 16.5\%$ | $y = -0.00000001\ x4 + 0.00000191\ x3 -$<br>$0.00009136\ x2 + 0.00002123\ x + 1.49026695$ |
| $0.5\% < \text{Cu} \leq 1.5\%$ | $y = 0.00000094\ x4 - 0.00012344\ x3 +$<br>$0.00581143\ x2 - 0.11657718\ x + 2.04608446$ |
| $1.5\% < \text{Cu} \leq 2.5\%$ | $y = 0.00000086\ x4 - 0.00011414\ x3 +$<br>$0.00544778\ x2 - 0.11058405\ x + 2.02873296$ |
| $2.5\% < \text{Cu} \leq 3.5\%$ | $y = 0.00000084\ x4 - 0.00011350\ x3 +$<br>$0.00547226\ x2 - 0.11227974\ x + 2.06865985$ |
| $3.5\% < \text{Cu} \leq 4.5\%$ | $y = 0.00000079\ x4 - 0.00010821\ x3 +$<br>$0.00528113\ x2 - 0.10966931\ x + 2.07776366$ |
| $4.5\% < \text{Cu} \leq 5.5\%$ | $y = 0.00000071\ x4 - 0.00009958\ x3 +$<br>$0.00492704\ x2 - 0.10365176\ x + 2.06138291$ |
| $5.5\% < \text{Cu} \leq 6.5\%$ | $y = 0.00000056\ x4 - 0.00008097\ x3 +$<br>$0.00409365\ x2 - 0.08768311\ x + 1.96982981$ |
| $6.5\% < \text{Cu} \leq 7.5\%$ | $y = 0.00000027\ x4 - 0.00004506\ x3 +$<br>$0.00245191\ x2 - 0.05526267\ x + 1.75554360$ |
| $7.5\% < \text{Cu} \leq 8.5\%$ | $y = 0.00000027\ x4 - 0.00004406\ x3 +$<br>$0.00240775\ x2 - 0.05474153\ x + 1.77586511$ |
| $8.5\% < \text{Cu} \leq 9.5\%$ | $y = 0.00000012\ x4 - 0.00002592\ x3 +$<br>$0.00156151\ x2 - 0.03786456\ x + 1.67380321$ |
| $10.5\% < \text{Cu} \leq 11.5\%$ | $y = -0.00000052\ x4 + 0.00005229\ x3 -$<br>$0.00191969\ x2 + 0.02965533\ x + 1.21335787$ |
| $11.5\% < \text{Cu} \leq 12.5\%$ | $y = -0.00000038\ x4 + 0.00003585\ x3 -$<br>$0.00123786\ x2 + 0.01692360\ x + 1.32322464$ |
| $12.5\% < \text{Cu} \leq 13.5\%$ | $y = -0.00000042\ x4 + 0.00004404\ x3 -$<br>$0.00172044\ x2 + 0.02841565\ x + 1.24656769$ |
| $13.5\% < \text{Cu} \leq 14.5\%$ | $y = -0.00000014\ x4 + 0.00000947\ x3 -$<br>$0.00016487\ x2 - 0.00253086\ x + 1.49539433$ |
| $14.5\% < \text{Cu} \leq 15.5\%$ | $y = -0.00000096\ x4 + 0.00011425\ x3 -$<br>$0.00507021\ x2 + 0.09730729\ x + 0.76978224$ |
| $15.5\% < \text{Cu} \leq 16.5\%$ | $y = 0.00000007\ x4 - 0.00001715\ x3 +$<br>$0.00109352\ x2 - 0.02884912\ x + 1.73506674$ |

In a composite filter device according to a preferred embodiment of the present invention, f1' is located outside the second pass band.

In a composite filter device according to a preferred embodiment of the present invention, f1<f1'<f2 is satisfied, where f1 is the center frequency of the first pass band. In this case, the other band pass filter is even less likely to be adversely affected by the Sezawa wave response at high temperatures.

In a composite filter device according to a preferred embodiment of the present invention, f1<f2<f1' is satisfied, where f1 is the center frequency of the first pass band.

In a composite filter device according to a preferred embodiment of the present invention, the first band pass filter includes a ladder filter that is connected to the antenna common terminal.

In a composite filter device according to a preferred embodiment of the present invention, the ladder filter includes a plurality of series arm resonators, and the series arm resonator that is closest to antenna common terminal among the plurality of series arm resonators is the elastic wave resonator. In this case, the other band pass filter is even less likely to be adversely affected by the Sezawa wave response.

In a composite filter device according to a preferred embodiment of the present invention, the first band pass filter includes a longitudinally coupled resonator elastic wave filter that is connected to a side of the ladder filter on an opposite side from the antenna common terminal.

In a composite filter device according to a preferred embodiment of the present invention, the dielectric film is made of a silicon oxide. In this case, the absolute value of the temperature coefficient of resonant frequency (TCF) is able to be made smaller.

In a composite filter device according to a preferred embodiment of the present invention, the IDT electrode includes a first metal film including one metal from among Pt, Mo, and Cu as a main component, and when y is f1'/f1, x is a film thickness of the dielectric film, f2L is a lower limit value of frequencies of the second pass band, and the first metal film is made of a metal and has a film thickness as listed in Table 2 below, y is smaller than f2L/f1 in a formula illustrated in Table 2 below. In Table 2 below, x4 represents x to the power of 4, x3 represents x to the power of 3, and x2 represents x to the power of 2. In this case, the other band pass filter is even less likely to be adversely affected by the Sezawa wave response.

TABLE 2

| NORMALIZED FILM THICKNESS OF FIRST METAL FILM | |
|---|---|
| 0.25% < Pt ≤ 0.75% | y = 0.00000096 x4 − 0.00011979 x3 + 0.00535955 x2 − 0.10212558 x + 1.91148793 |
| 0.75% < Pt ≤ 1.25% | y = 0.00000091 x4 − 0.00011525 x3 + 0.00522036 x2 − 0.10069362 x + 1.93521887 |
| 1.25% < Pt ≤ 1.75% | y = 0.00000103 x4 − 0.00013182 x3 + 0.00602995 x2 − 0.11792508 x + 2.09489847 |
| 1.75% < Pt ≤ 2.25% | y = 0.00000109 x4 − 0.00014124 x3 + 0.00650460 x2 − 0.12836964 x + 2.20470460 |
| 2.25% < Pt ≤ 2.75% | y = 0.00000113 x4 − 0.00014692 x3 + 0.00680623 x2 − 0.13536545 x + 2.28964825 |
| 2.75% < Pt ≤ 3.25% | y = 0.00000111 x4 − 0.00014601 x3 + 0.00681451 x2 − 0.13665429 x + 2.33392938 |
| 3.25% < Pt ≤ 3.75% | y = 0.00000119 x4 − 0.00015728 x3 + 0.00737777 x2 − 0.14901122 x + 2.45977087 |
| 3.75% < Pt ≤ 4.25% | y = 0.00000123 x4 − 0.00016379 x3 + 0.00772873 x2 − 0.15723896 x + 2.55622092 |
| 4.25% < Pt ≤ 4.75% | y = 0.00000121 x4 − 0.00016214 x3 + 0.00769286 x2 − 0.15751557 x + 2.59312937 |
| 4.75% < Pt ≤ 5.25% | y = 0.00000174 x4 − 0.00022691 x3 + 0.01058009 x2 − 0.21389115 x + 3.02814932 |
| 5.25% < Pt ≤ 5.75% | y = 0.00000247 x4 − 0.00032401 x3 + 0.01528948 x2 − 0.31238987 x + 3.79970631 |
| 5.75% < Pt ≤ 6.25% | y = 0.00000196 x4 − 0.00026015 x3 + 0.01236721 x2 − 0.25465724 x + 3.40977449 |
| 6.25% < Pt ≤ 6.75% | y = 0.00000167 x4 − 0.00022169 x3 + 0.01050080 x2 − 0.21577253 x + 3.14097300 |
| 6.75% < Pt ≤ 7.25% | y = 0.00000167 x4 − 0.00022176 x3 + 0.01051467 x2 − 0.21651968 x + 3.17671777 |
| 7.25% < Pt ≤ 7.75% | y = 0.00000166 x4 − 0.00022134 x3 + 0.01050380 x2 − 0.21672919 x + 3.20799513 |
| 7.75% < Pt ≤ 8.25% | y = 0.00000150 x4 − 0.00020368 x3 + 0.00980313 x2 − 0.20524827 x + 3.16834265 |
| 8.25% < Pt ≤ 8.75% | y = 0.00000085 x4 − 0.00012074 x3 + 0.00592600 x2 − 0.12681719 x + 2.61288002 |
| 8.75% < Pt ≤ 9.25% | y = 0.00000111 x4 − 0.00015274 x3 + 0.00741930 x2 − 0.15748992 x + 2.87039438 |
| 9.25% < Pt ≤ 9.75% | y = 0.00000105 x4 − 0.00014596 x3 + 0.00710645 x2 − 0.15151217 x + 2.85463183 |
| 9.75% < Pt ≤ 10.25% | y = 0.00000100 x4 − 0.00013894 x3 + 0.00678214 x2 − 0.14528844 x + 2.83677788 |
| 10.25% < Pt ≤ 10.75% | y = 0.00000094 x4 − 0.00013176 x3 + 0.00644924 x2 − 0.13888705 x + 2.81740252 |
| 10.75% < Pt ≤ 11.25% | y = 0.00000057 x4 − 0.00008628 x3 + 0.00439990 x2 − 0.09911499 x + 2.55984107 |
| 0.5% < Mo ≤ 1.5% | y = 0.00000086 x4 − 0.00011477 x3 + 0.00547211 x2 − 0.11082241 x + 2.01030202 |
| 1.5% < Mo ≤ 2.5% | y = 0.00000069 x4 − 0.00009656 x3 + 0.00481601 x2 − 0.10151017 x + 1.98701155 |
| 2.5% < Mo ≤ 3.5% | y = 0.00000031 x4 − 0.00005031 x3 + 0.00275675 x2 − 0.06203059 x + 1.72906604 |
| 3.5% < Mo ≤ 4.5% | y = −0.00000013 x4 + 0.00000558 x3 + 0.00017119 x2 − 0.01044443 x + 1.37200658 |
| 4.5% < Mo ≤ 5.5% | y = −0.00000051 x4 + 0.00005558 x3 − 0.00219606 x2 + 0.03780068 x + 1.03279022 |
| 5.5% < Mo ≤ 6.5% | y = −0.00000080 x4 + 0.00009310 x3 − 0.00401794 x2 + 0.07571679 x + 0.76564163 |
| 6.5% < Mo ≤ 7.5% | y = −0.00000087 x4 + 0.00010545 x3 − 0.00468570 x2 + 0.09061546 x + 0.66729105 |
| 7.5% < Mo ≤ 8.5% | y = −0.00000082 x4 + 0.00010128 x3 − 0.00457852 x2 + 0.08976261 x + 0.68639844 |
| 8.5% < Mo ≤ 9.5% | y = −0.00000060 x4 + 0.00007497 x3 − 0.00342455 x2 + 0.06742932 x + 0.86713651 |
| 10.5% < Mo ≤ 11.5% | y = −0.00000017 x4 + 0.00002091 x3 − 0.00096441 x2 + 0.01844249 x + 1.24807166 |
| 11.5% < Mo ≤ 12.5% | y = −0.00000015 x4 + 0.00001931 x3 − 0.00090997 x2 + 0.01753506 x + 1.27433165 |
| 12.5% < Mo ≤ 13.5% | y = −0.00000006 x4 + 0.00000784 x3 − 0.00039201 x2 + 0.00714081 x + 1.37199243 |
| 13.5% < Mo ≤ 14.5% | y = −0.00000003 x4 + 0.00000446 x3 − 0.00024129 x2 + 0.00395507 x + 1.41813718 |
| 14.5% < Mo ≤ 15.5% | y = −0.00000003 x4 + 0.00000459 x3 − 0.00023227 x2 + 0.00312729 x + 1.45148162 |
| 15.5% < Mo ≤ 16.5% | y = −0.00000001 x4 + 0.00000191 x3 − 0.00009136 x2 + 0.00002123 x + 1.49026695 |
| 0.5% < Cu ≤ 1.5% | y = 0.00000094 x4 − 0.00012344 x3 + 0.00581143 x2 − 0.11657718 x + 2.04608446 |
| 1.5% < Cu ≤ 2.5% | y = 0.00000086 x4 − 0.00011414 x3 + 0.00544778 x2 − 0.11058405 x + 2.02873296 |
| 2.5% < Cu ≤ 3.5% | y = 0.00000084 x4 − 0.00011350 x3 + 0.00547226 x2 − 0.11227974 x + 2.06865985 |
| 3.5% < Cu ≤ 4.5% | y = 0.00000079 x4 − 0.00010821 x3 + 0.00528113 x2 − 0.10966931 x + 2.07776366 |
| 4.5% < Cu ≤ 5.5% | y = 0.00000071 x4 − 0.00009958 x3 + 0.00492704 x2 − 0.10365176 x + 2.06138291 |
| 5.5% < Cu ≤ 6.5% | y = 0.00000056 x4 − 0.00008097 x3 + 0.00409365 x2 − 0.08768311 x + 1.96982981 |
| 6.5% < Cu ≤ 7.5% | y = 0.00000027 x4 − 0.00004506 x3 + 0.00245191 x2 − 0.05526267 x + 1.75554360 |
| 7.5% < Cu ≤ 8.5% | y = 0.00000027 x4 − 0.00004406 x3 + 0.00240775 x2 − 0.05474153 x + 1.77586511 |
| 8.5% < Cu ≤ 9.5% | y = 0.00000012 x4 − 0.00002592 x3 + 0.00156151 x2 − 0.03786456 x + 1.67380321 |
| 10.5% < Cu ≤ 11.5% | y = −0.00000052 x4 + 0.00005229 x3 − 0.00191969 x2 + 0.02965533 x + 1.21335787 |
| 11.5% < Cu ≤ 12.5% | y = −0.00000038 x4 + 0.00003585 x3 − 0.00123786 x2 + 0.01692360 x + 1.32322464 |
| 12.5% < Cu ≤ 13.5% | y = −0.00000042 x4 + 0.00004404 x3 − 0.00172044 x2 + 0.02841565 x + 1.24656769 |
| 13.5% < Cu ≤ 14.5% | y = −0.00000014 x4 + 0.00000947 x3 − 0.00016487 x2 − 0.00253086 x + 1.49539433 |
| 14.5% < Cu ≤ 15.5% | y = −0.00000096 x4 + 0.00011425 x3 − 0.00507021 x2 + 0.09730729 x + 0.76978224 |
| 15.5% < Cu ≤ 16.5% | y = 0.00000007 x4 − 0.00001715 x3 + 0.00109352 x2 − 0.02884912 x + 1.73506674 |

In a composite filter device according to a preferred embodiment of the present invention, the IDT electrode includes a first metal film including one metal from among Pt, Mo, and Cu as a main component, and when y is f1′/f1, x is a film thickness of the dielectric film, f2H is an upper limit value of frequencies of the second pass band, and the first metal film is made of a metal and has a film thickness as listed in Table 3 below, y is larger than f2H/f1 in a formula illustrated in Table 3 below.

In below Table 3, x4 represents x to the power of 4, x3 represents x to the power of 3, and x2 represents x to the power of 2.

TABLE 3

| NORMALIZED FILM THICKNESS OF FIRST METAL FILM | |
|---|---|
| 0.25% < Pt ≤ 0.75% | y = 0.00000096 x4 − 0.00011979 x3 + 0.00535955 x2 − 0.10212558 x + 1.91148793 |
| 0.75% < Pt ≤ 1.25% | y = 0.00000091 x4 − 0.00011525 x3 + 0.00522036 x2 − 0.10069362 x + 1.93521887 |
| 1.25% < Pt ≤ 1.75% | y = 0.00000103 x4 − 0.00013182 x3 + 0.00602995 x2 − 0.11792508 x + 2.09489847 |
| 1.75% < Pt ≤ 2.25% | y = 0.00000109 x4 − 0.00014124 x3 + 0.00650460 x2 − 0.12836964 x + 2.20470460 |
| 2.25% < Pt ≤ 2.75% | y = 0.00000113 x4 − 0.00014692 x3 + 0.00680623 x2 − 0.13536545 x + 2.28964825 |
| 2.75% < Pt ≤ 3.25% | y = 0.00000111 x4 − 0.00014601 x3 + 0.00681451 x2 − 0.13665429 x + 2.33392938 |
| 3.25% < Pt ≤ 3.75% | y = 0.00000119 x4 − 0.00015728 x3 + 0.00737777 x2 − 0.14901122 x + 2.45977087 |
| 3.75% < Pt ≤ 4.25% | y = 0.00000123 x4 − 0.00016379 x3 + 0.00772873 x2 − 0.15723896 x + 2.55622092 |
| 4.25% < Pt ≤ 4.75% | y = 0.00000121 x4 − 0.00016214 x3 + 0.00769286 x2 − 0.15751557 x + 2.59312937 |
| 4.75% < Pt ≤ 5.25% | y = 0.00000174 x4 − 0.00022691 x3 + 0.01058009 x2 − 0.21389115 x + 3.02814932 |
| 5.25% < Pt ≤ 5.75% | y = 0.00000247 x4 − 0.00032401 x3 + |

TABLE 3-continued

| NORMALIZED FILM THICKNESS OF FIRST METAL FILM | |
|---|---|
| | $0.01528948 x^2 - 0.31238987 x + 3.79970631$ |
| $5.75\% < Pt \leq 6.25\%$ | $y = 0.00000196 x^4 - 0.00026015 x^3 + 0.01236721 x^2 - 0.25465724 x + 3.40977449$ |
| $6.25\% < Pt \leq 6.75\%$ | $y = 0.00000167 x^4 - 0.00022169 x^3 + 0.01050080 x^2 - 0.21577253 x + 3.14097300$ |
| $6.75\% < Pt \leq 7.25\%$ | $y = 0.00000167 x^4 - 0.00022176 x^3 + 0.01051467 x^2 - 0.21651968 x + 3.17671777$ |
| $7.25\% < Pt \leq 7.75\%$ | $y = 0.00000166 x^4 - 0.00022134 x^3 + 0.01050380 x^2 - 0.21672919 x + 3.20799513$ |
| $7.75\% < Pt \leq 8.25\%$ | $y = 0.00000150 x^4 - 0.00020368 x^3 + 0.00980313 x^2 - 0.20524827 x + 3.16834265$ |
| $8.25\% < Pt \leq 8.75\%$ | $y = 0.00000085 x^4 - 0.00012074 x^3 + 0.00592600 x^2 - 0.12681719 x + 2.61288002$ |
| $8.75\% < Pt\ 9.25\%$ | $y = 0.00000111 x^4 - 0.00015274 x^3 + 0.00741930 x^2 - 0.15748992 x + 2.87039438$ |
| $9.25\% < Pt \leq 9.75\%$ | $y = 0.00000105 x^4 - 0.00014596 x^3 + 0.00710645 x^2 - 0.15151217 x + 2.85463183$ |
| $9.75\% < Pt \leq 10.25\%$ | $y = 0.00000100 x^4 - 0.00013894 x^3 + 0.00678214 x^2 - 0.14528844 x + 2.83677788$ |
| $10.25\% < Pt \leq 10.75\%$ | $y = 0.00000094 x^4 - 0.00013176 x^3 + 0.00644924 x^2 - 0.13888705 x + 2.81740252$ |
| $10.75\% < Pt \leq 11.25\%$ | $y = 0.00000057 x^4 - 0.00008628 x^3 + 0.00439990 x^2 - 0.09911499 x + 2.55984107$ |
| $0.5\% < Mo \leq 1.5\%$ | $y = 0.00000086 x^4 - 0.00011477 x^3 + 0.00547211 x^2 - 0.11082241 x + 2.01030202$ |
| $1.5\% < Mo \leq 2.5\%$ | $y = 0.00000069 x^4 - 0.00009656 x^3 + 0.00481601 x^2 - 0.10151017 x + 1.98701155$ |
| $2.5\% < Mo \leq 3.5\%$ | $y = 0.00000031 x^4 - 0.00005031 x^3 + 0.00275675 x^2 - 0.06203059 x + 1.72906604$ |
| $3.5\% < Mo \leq 4.5\%$ | $y = -0.00000013 x^4 + 0.00000558 x^3 + 0.00017119 x^2 - 0.01044443 x + 1.37200658$ |
| $4.5\% < Mo \leq 5.5\%$ | $y = -0.00000051 x^4 + 0.00005558 x^3 - 0.00219606 x^2 + 0.03780068 x + 1.03279022$ |
| $5.5\% < Mo \leq 6.5\%$ | $y = -0.00000080 x^4 + 0.00009310 x^3 - 0.00401794 x^2 + 0.07571679 x + 0.76564163$ |
| $6.5\% < Mo \leq 7.5\%$ | $y = -0.00000087 x^4 + 0.00010545 x^3 - 0.00468570 x^2 + 0.09061546 x + 0.66729105$ |
| $7.5\% < Mo \leq 8.5\%$ | $y = -0.00000082 x^4 + 0.00010128 x^3 - 0.00457852 x^2 + 0.08976261 x + 0.68639844$ |
| $8.5\% < Mo \leq 9.5\%$ | $y = -0.00000060 x^4 + 0.00007497 x^3 - 0.00342455 x^2 + 0.06742932 x + 0.86713651$ |
| $10.5\% < Mo \leq 11.5\%$ | $y = -0.00000017 x^4 + 0.00002091 x^3 - 0.00096441 x^2 + 0.01844249 x + 1.24807166$ |
| $11.5\% < Mo \leq 12.5\%$ | $y = -0.00000015 x^4 + 0.00001931 x^3 - 0.00090997 x^2 + 0.01753506 x + 1.27433165$ |
| $12.5\% < Mo \leq 13.5\%$ | $y = -0.00000006 x^4 + 0.00000784 x^3 - 0.00039201 x^2 + 0.00714081 x + 1.37199243$ |
| $13.5\% < Mo \leq 14.5\%$ | $y = -0.00000003 x^4 + 0.00000446 x^3 - 0.00024129 x^2 + 0.00395507 x + 1.41813718$ |
| $14.5\% < Mo \leq 15.5\%$ | $y = -0.00000003 x^4 + 0.00000459 x^3 - 0.00023227 x^2 + 0.00312729 x + 1.45148162$ |
| $15.5\% < Mo \leq 16.5\%$ | $y = -0.00000001 x^4 + 0.00000191 x^3 - 0.00009136 x^2 + 0.00002123 x + 1.49026695$ |
| $0.5\% < Cu \leq 1.5\%$ | $y = 0.00000094 x^4 - 0.00012344 x^3 + 0.0058l143 x^2 - 0.11657718 x + 2.04608446$ |
| $1.5\% < Cu \leq 2.5\%$ | $y = 0.00000086 x^4 - 0.00011414 x^3 + 0.00544778 x^2 - 0.11058405 x + 2.02873296$ |
| $2.5\% < Cu \leq 3.5\%$ | $y = 0.00000084 x^4 - 0.00011350 x^3 + 0.00547226 x^2 - 0.11227974 x + 2.06865985$ |
| $3.5\% < Cu \leq 4.5\%$ | $y = 0.00000079 x^4 - 0.00010821 x^3 + 0.00528113 x^2 - 0.10966931 x + 2.07776366$ |
| $4.5\% < Cu \leq 5.5\%$ | $y = 0.00000071 x^4 - 0.00009958 x^3 + 0.00492704 x^2 - 0.10365176 x + 2.06138291$ |
| $5.5\% < Cu \leq 6.5\%$ | $y = 0.00000056 x^4 - 0.00008097 x^3 + 0.00409365 x^2 - 0.08768311 x + 1.96982981$ |
| $6.5\% < Cu \leq 7.5\%$ | $y = 0.00000027 x^4 - 0.00004506 x^3 + 0.00245191 x^2 - 0.05526267 x + 1.75554360$ |
| $7.5\% < Cu \leq 8.5\%$ | $y = 0.00000027 x^4 - 0.00004406 x^3 + 0.00240775 x^2 - 0.05474153 x + 1.77586511$ |
| $8.5\% < Cu \leq 9.5\%$ | $y = 0.00000012 x^4 - 0.00002592 x^3 + 0.00156151 x^2 - 0.03786456 x + 1.67380321$ |
| $10.5\% < Cu \leq 11.5\%$ | $y = -0.00000052 x^4 + 0.00005229 x^3 - 0.00191969 x^2 + 0.02965533 x + 1.21335787$ |
| $11.5\% < Cu \leq 12.5\%$ | $y = -0.00000038 x^4 + 0.00003585 x^3 - 0.00123786 x^2 + 0.01692360 x + 1.32322464$ |
| $12.5\% < Cu \leq 13.5\%$ | $y = -0.00000042 x^4 + 0.00004404 x^3 - 0.00172044 x^2 + 0.02841565 x + 1.24656769$ |
| $13.5\% < Cu \leq 14.5\%$ | $y = -0.00000014 x^4 + 0.00000947 x^3 - 0.00016487 x^2 - 0.00253086 x + 1.49539433$ |
| $14.5\% < Cu \leq 15.5\%$ | $y = -0.00000096 x^4 + 0.00011425 x^3 - 0.00507021 x^2 + 0.09730729 x + 0.76978224$ |
| $15.5\% < Cu \leq 16.5\%$ | $y = 0.00000007 x^4 - 0.00001715 x^3 + 0.00109352 x^2 - 0.02884912 x + 1.73506674$ |

In a composite filter device according to a preferred embodiment of the present invention, the composite filter device further includes a second metal film that is stacked on the first metal film and has a lower electrical resistance than the first metal film. The second metal film is preferably made of an alloy including Al or Au as a main component.

In a composite filter device according to a preferred embodiment of the present invention, the first metal film is made of an alloy including Mo and Nb as main components.

A high-frequency front end circuit according to a preferred embodiment of the present invention includes a composite filter device according to a preferred embodiment of the present invention; and at least one of a switch, a power amplifier, an LNA, a diplexer, a circulator, and an isolator.

A communication device according to a preferred embodiment of the present invention includes a high-frequency front end circuit according to a preferred embodiment of the present invention; an RFIC; and a BBIC.

Preferred embodiments of the present invention provide composite filter devices in each of which a Sezawa wave of a band pass filter that utilizes Rayleigh waves is unlikely to adversely affect a band pass filter having a higher frequency band than the band pass filter that utilizes Rayleigh waves, high-frequency front end circuits that each include composite filter devices according to preferred embodiments of the present invention, and communication devices.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, preferred embodiments of the present invention will be described with reference to the drawings.

Preferred embodiments of the present invention described in the present specification are illustrative examples, and it should be noted that portions of the configurations illustrated in different preferred embodiments may be substituted for one another or combined with one another.

First Preferred Embodiment

Figure 1:
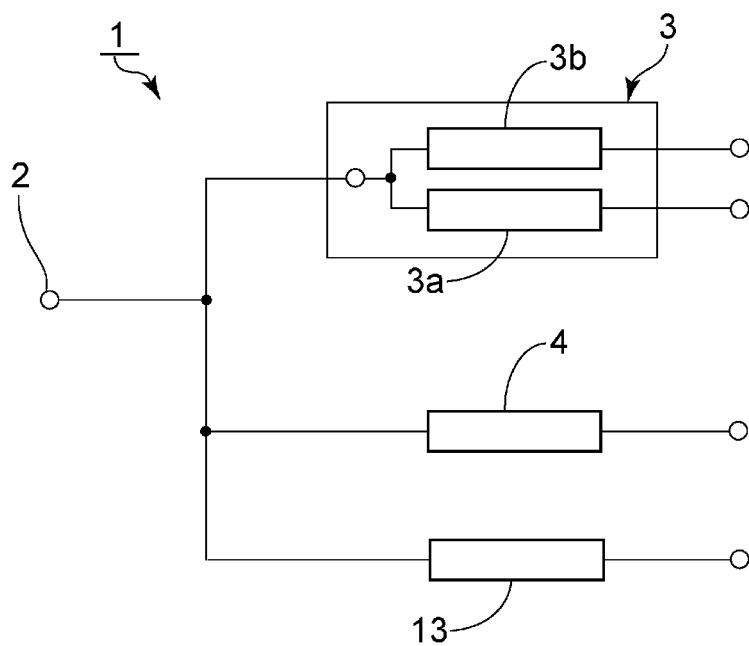
FIG. 1 is a schematic circuit diagram of a composite filter device according to a first preferred embodiment of the present invention.

FIG. 1 is a schematic circuit diagram of a composite filter device according to a first preferred embodiment of the present invention. A composite filter device 1 is used in carrier aggregation. The composite filter device 1 includes an antenna common terminal 2 that defines and functions as a common terminal. First to third reception filters 3a, 4, and 13 and a transmission filter 3b are connected to the antenna common terminal 2. Of course, only a plurality of reception filters may instead be connected to the antenna common terminal 2 in a preferred embodiment of the present invention.

In FIG. 1, the first to third reception filters 3a, 4, and 13 and the transmission filter 3b are schematically depicted as blocks. The first to third reception filters 3a, 4, and 13 and the transmission filter 3b are provided to support a plurality of carriers, that is, a plurality of communication methods.

The first reception filter 3a and the transmission filter 3b define a composite filter 3.

The first reception filter 3a is a first band pass filter having a first pass band. The first pass band is preferably, for example, a Band 3 reception frequency band and is a frequency band extending from about 1805 MHz to about 1880 MHz. In addition, the second reception filter 4 is a second band pass filter having a second pass band. The second pass band is preferably, for example, a Band 7 reception frequency band and is a frequency band extending from about 2620 MHz to about 2690 MHz. Therefore, the second pass band is located at higher frequencies than the first pass band.

The first reception filter 3a preferably includes an IDT electrode and a SiO$_2$ film that are stacked on a LiNbO$_3$ substrate, for example. Rayleigh waves that propagate along the LiNbO$_3$ substrate are utilized. When an alternating-current voltage is applied to the IDT electrode, not only Rayleigh waves but also Sezawa waves, which are a higher mode of the Rayleigh waves, are excited.

A feature of the present preferred embodiment is that the material of the IDT electrode is chosen and the film thicknesses of the IDT electrode and the SiO$_2$ film are set such that f1' does not overlap f2, where f1' is the frequency of a Sezawa wave of the first reception filter 3a and f2 is the center frequency of the second pass band in the second reception filter 4. Therefore, in the present preferred embodiment, f1' is at a different position from f2. Consequently, the insertion loss of the second reception filter 4 is unlikely to be degraded by the effect of the Sezawa wave response of the first reception filter 3a. That is, the second reception filter 4 is unlikely to be adversely affected by the Sezawa wave response of the first reception filter 3a. From the viewpoint of making the second reception filter 4 even less likely to be affected by Sezawa wave response, it is preferable that f1' be located outside the second pass band.

It is preferable that f1' and f2 satisfy f1<f1'<f2, where f1 is the center frequency of the first pass band of the first reception filter 3a. Since the temperature coefficient of resonant frequency (TCF) of the higher mode is negative, f1' shifts toward the low frequency side as the device temperature becomes higher. Therefore, in the case in which f1<f1'<f2 is satisfied, the second reception filter 4 is unlikely to be adversely affected by the Sezawa wave response even at high temperatures. Of course, in preferred embodiments of the present invention, it is sufficient that f1' be located at a different position from f2, and f1<f2<f1' may be satisfied. In addition, in the case in which f1<f1'<f2, f1' is further preferably located outside the second pass band. In this case, the second reception filter 4 is even more unlikely to be adversely affected by the Sezawa wave response even at high temperatures. Hereafter, a composite filter included in the composite filter device 1 will be described in detail, and then specific ways to ensure that f1' and f2 do not overlap will be described.

Figure 2:
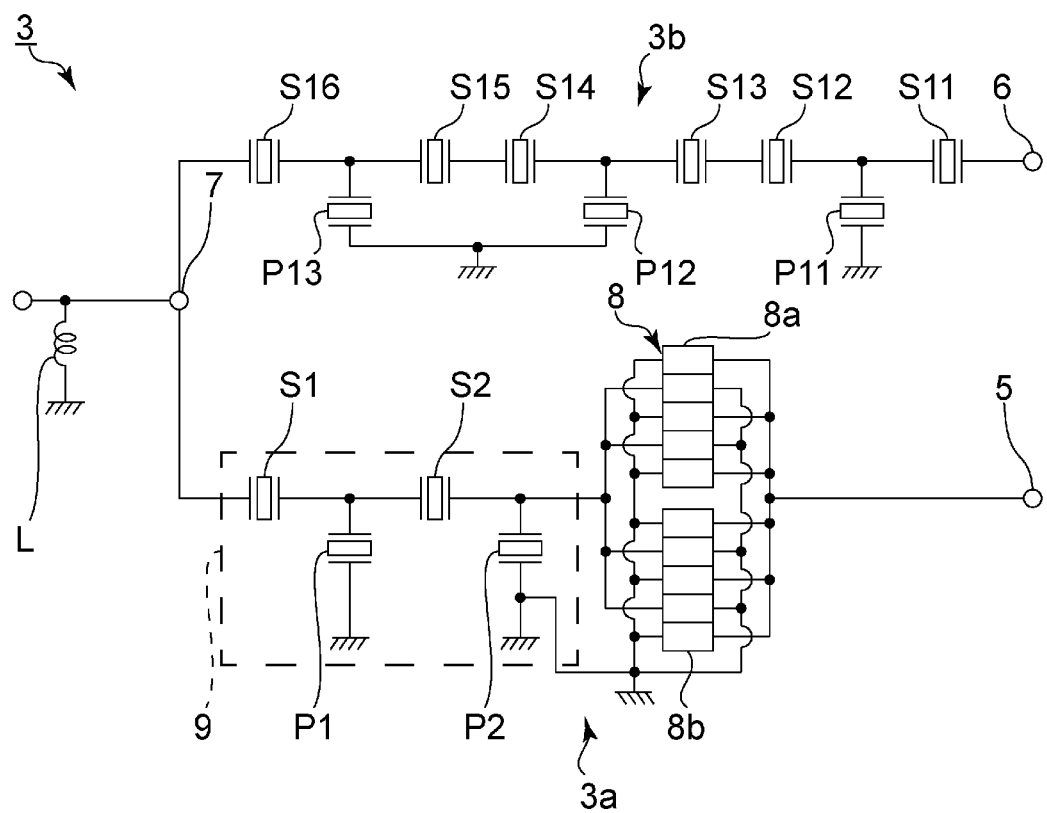
FIG. 2 is a circuit diagram illustrating a composite filter as an example of a composite filter included in a composite filter device according to a preferred embodiment of the present invention.

FIG. 2 is a circuit diagram illustrating a composite filter as an example of a composite filter included in the composite filter device according to the present preferred embodiment. Specifically, FIG. 2 is a circuit diagram illustrating the composite filter 3.

As described above, the composite filter 3 includes the first reception filter 3a and the transmission filter 3b. The composite filter 3 includes a common terminal 7. The common terminal 7 is connected to the antenna common terminal 2 illustrated in FIG. 1. An impedance-matching inductor L is connected between the common terminal 7 and the ground potential.

The first reception filter 3a is connected between the common terminal 7 and a reception terminal 5. The transmission filter 3b is connected between the common terminal 7 and a transmission terminal 6.

In the transmission filter 3b, a plurality of series arm resonators S11 to S16 and a plurality of parallel arm resonators P11 to P13 are connected to the common terminal 7.

Figure 3:
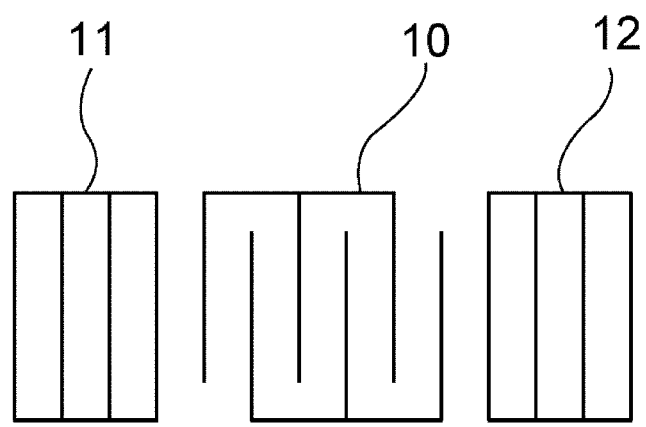
FIG. 3 is a schematic plan view illustrating the electrode structure of an elastic wave resonator according to the first preferred embodiment of the present invention.

In the first reception filter 3a, a ladder filter 9 is connected to the common terminal 7. The ladder filter 9 includes series arm resonators S1 and S2 and parallel arm resonators P1 and P2. The series arm resonators S1 and S2 and the parallel arm resonators P1 and P2 are each preferably defined by a one-port elastic wave resonator. The one-port elastic wave resonators have the electrode structure illustrated in FIG. 3. As illustrated in FIG. 3, reflectors 11 and 12 are provided at both sides of an IDT electrode 10 in an elastic wave propagation direction. In this manner, a one-port elastic wave resonator is provided.

In addition, a longitudinally coupled resonator elastic wave filter 8 is connected between the ladder filter 9 and the reception terminal 5. The longitudinally coupled resonator elastic wave filter 8 includes elastic wave filter units 8a and 8b. The elastic wave filter units 8a and 8b are each defined by providing and longitudinally coupling five elastic wave resonators in the elastic wave propagation direction. More specifically, the elastic wave filter units 8a and 8b are preferably, for example, five-IDT elastic wave filters that each include five IDT electrodes arranged in the elastic wave propagation direction, and reflectors provided on both sides of the five IDT electrodes. In FIG. 1, the second and third reception filters 4 and 13 are schematically illustrated as blocks, but preferably have the same or substantially the same configuration as the first reception filter 3a.

In the composite filter device 1, all of the elastic wave resonators defining the series arm resonators S1 and S2, the parallel arm resonators P1 and P2, and the longitudinally coupled resonator elastic wave filter 8 are defined by a specific elastic wave resonator as described below. In this manner, f1' is adjusted so as to be located at a different position from f2. Hereafter, the structure of the specific elastic wave resonator will be described using the series arm resonator S1 as a representative example.

Figure 4:
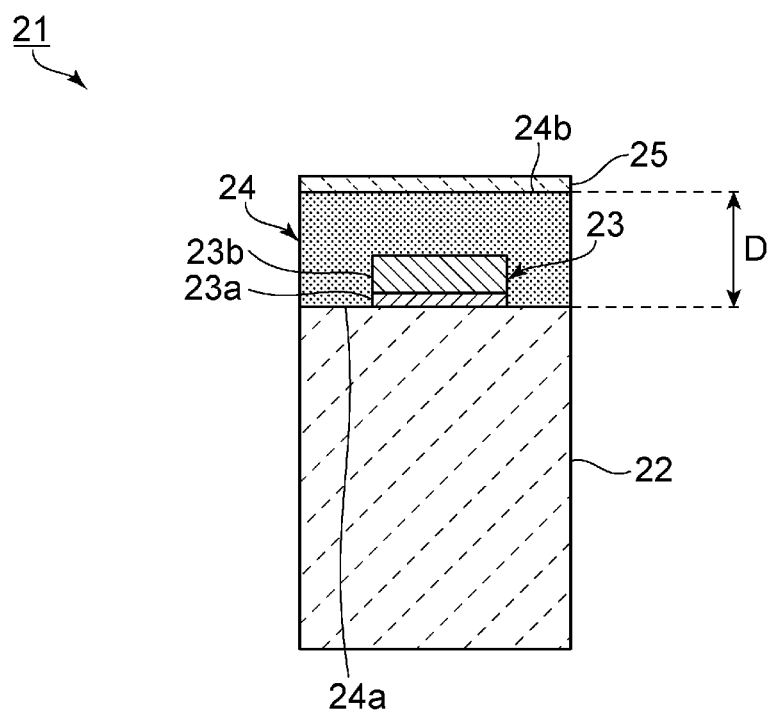
FIG. 4 is a schematic partial cut away front sectional view of an elastic wave resonator included in a first reception filter of the composite filter device according to the first preferred embodiment of the present invention.

FIG. 4 is a schematic partial cut away front sectional view of an elastic wave resonator included in the first reception filter of the composite filter device according to the first preferred embodiment of the present invention. As illustrated in FIG. 4, an IDT electrode 23 is provided on a $LiNbO_3$ substrate 22. A dielectric film 24 made of $SiO_2$ is stacked so as to cover the IDT electrode 23. The absolute value of the temperature coefficient of resonant frequency may be made smaller by stacking the dielectric film 24. A SiN film 25 is stacked on the dielectric film 24. Of course, the SiN film 25 does not have to be provided.

The IDT electrode 23 includes first and second metal films 23a and 23b. The second metal film 23b is stacked on the first metal film 23a. In the present preferred embodiment, the first metal film 23a is preferably a Pt film, for example. In addition, the second metal film 23b is preferably an Al film, for example. Therefore, the second metal film 23b has a lower electrical resistance than the first metal film 23a. Thus, it is preferable that the second metal film 23b have a lower electrical resistance than the first metal film 23a.

In the composite filter device 1, the film thickness of the first metal film 23a (hereafter, may be referred to as "Pt film thickness") and the film thickness of the dielectric film 24 (hereafter, may be referred to as "$SiO_2$ film thickness") are set such that f1' is located at a different position from f2. That is, it is ensured that the second reception filter 4 is unlikely to be adversely affected by the Sezawa wave response of the first reception filter 3a. The film thicknesses of the first metal film 23a and the dielectric film 24 are provided as percentages of a wavelength λ determined by the electrode finger pitch of the IDT electrode 23. In addition, the film thickness of the dielectric film 24 is represented by a distance D between first and second main surfaces 24a and 24b of the dielectric film 24. The first and second main surfaces 24a and 24b face each other, and the first main surface 24a is the main surface on the $LiNbO_3$ substrate 22 side.

Hereafter, a non-limiting example of a method used to set the film thickness of the first metal film 23a and the $SiO_2$ film thickness such that f1' is located at a different position from f2 will be described.

As described above, in the present preferred embodiment, preferably, the first reception filter 3a is a Band 3 reception filter and the second reception filter 4 is a Band 7 reception filter, for example. The center frequency f1 of the Band 3 reception frequency band, which is the first pass band, is about 1842.5 MHz. In addition, the center frequency f2 of the Band 7 reception frequency band, which is the second pass band, is about 2655 MHz. Therefore, in the present preferred embodiment f2/f1=1.441.

Figure 5:
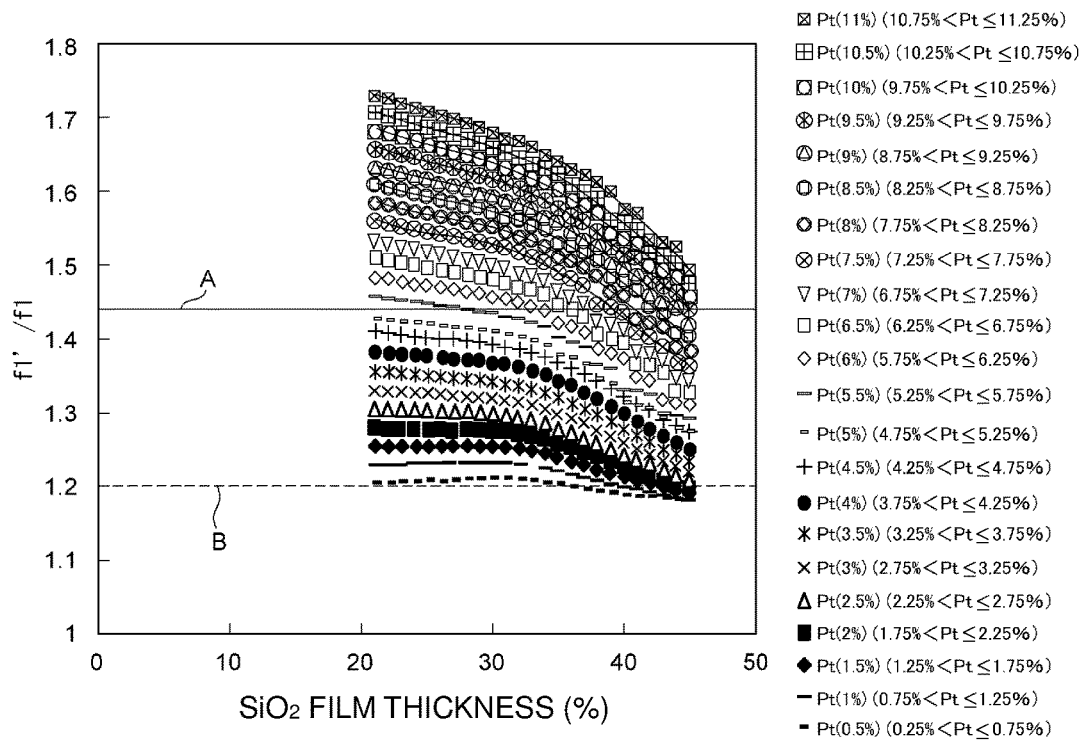
FIG. 5 is a diagram illustrating the relationship between $SiO_2$ film thickness and $f1'/f1$ when the film thickness of Pt, which is a first metal film, is changed.

FIG. 5 is a diagram illustrating the relationship between the $SiO_2$ film thickness and f1'/f1 when the film thickness of Pt, which is the first metal film, is changed. f1'/f1 may be obtained from the ratio of the acoustic velocity of a Sezawa wave to the acoustic velocity of a Rayleigh wave (acoustic velocity of Sezawa wave/acoustic velocity of Rayleigh wave).

In this case, the following is preferable in order to ensure that f1' is located at a different position from f2 by satisfying f1<f1'<f2. When f1<f1'<f2, 1<f1'/f1<f2/f1, and therefore, 1<f1'/f1<1.441 when f2/f1=1.441 is substituted. When a straight line f2/f1 denoted by A in FIG. 5 is 1.441, the region below (f1'/f1=1.441) is preferable in order to satisfy 1<f1'/f1<1.441.

Specifically, when the Pt film thickness is about 0.5%, f1'/f1 is approximated by below Formula (1).

$$y = 0.00000096 \times x^4 - 0.00011979 \times x^3 + 0.00535955 \times x^2 - 0.10212558 \times x + 1.91148793 \quad \text{Formula (1)}$$

Here, y is f1'/f1 and x is the $SiO_2$ film thickness. f1<f1'<f2 is ensured when the conditions of the film thickness of the $SiO_2$ film and the Pt film thickness expressed by this relationship are in the region below f2/f1=f1'/f1=1.441, that is, by setting the thickness of the Pt film, which is the first metal film, and the $SiO_2$ film thickness so as to satisfy below Formula (2).

$$1.441 > 0.00000096 \times x^4 - 0.00011979 \times x^3 + 0.00535955 \times x^2 - 0.10212558 \times x + 1.91148793 \quad \text{Formula (2)}$$

It is able to be ensured that the second reception filter 4 is unlikely to be adversely affected by the Sezawa wave response of the first reception filter 3a by satisfying f1<f1'<f2.

In the present preferred embodiment, all of the elastic wave resonators defining the series arm resonators S1 and S2, the parallel arm resonators P1 and P2, and the longitudinally coupled resonator elastic wave filter 8 are defined by the specific elastic wave resonator described above. Of course, in preferred embodiments of the present invention, it would be sufficient for at least one of the resonators defining the series arm resonators S1 and S2, the parallel arm resonators P1 and P2, and the longitudinally coupled resonator elastic wave filter 8 to be defined by the specific elastic wave resonator described above. However, from the viewpoint of more effectively reducing or preventing the effect of the Sezawa wave response on the second reception filter 4, it is preferable that at least the longitudinally coupled resonator elastic wave filter 8 be defined by the specific resonator.

Furthermore, regarding the return loss of the ladder filter 9 on the antenna common terminal 2 side, the higher mode response generated by the series arm resonator S1 that is closest to the antenna common terminal 2 is the largest, and therefore it is preferable that the series arm resonator S1 that is closest to the antenna common terminal 2 be defined by the specific elastic wave resonator.

The first metal film 23a is preferably made of Pt, for example, in the first preferred embodiment, but another metal may be used instead. It is preferable that the first metal film 23a be a metal film including one metal from, for example, among Pt, Cu, and Mo as a main component. In this case, better filter characteristics are obtained using Rayleigh waves. The meaning of "containing a metal as a main component" is not limited to meaning only that metal, and also includes the meaning of including an alloy including about 50% by weight or more of that metal. In addition, in the case in which the first metal film 23a and another metal that is heavier than Al are stacked on top of one another, the film thickness, au be converted into a film thickness that is equivalent to the film thickness of the first metal film 23a by dividing the sum of the weight of the first metal film 23a, which is calculated from the film thickness and the density of the first metal film 23a, and the weight of metal film that is heavier than Al, which is calculated from the film thickness and the density of the metal film that is heavier than Al, by the density of the first metal film 23a. In addition, the second metal film 23b is preferably made of Al, for example, but another metal may be used instead. An alloy including Al or Au, for example, as a main component is preferable for the second metal film 23b. The second metal film 23b does not have to be provided.

In addition, although the dielectric film 24, which is a $SiO_2$ film, covers the IDT electrode 23 in the first preferred embodiment, a dielectric film including a silicon oxide as a main component other than a $SiO_2$ film may be used instead. The meaning of "a dielectric film including a silicon oxide as a main component" is not limited to meaning $SiO_2$ and may refer to a film that includes a dielectric material including about 50% by weight or more of $SiO_x$ (x is an integer).

Although a combination of a Band 3 reception filter and a Band 7 reception filter is used in the first preferred embodiment, any of the Band combinations listed in below Table 4 may be used instead, for example. In Table 4, for example, in the case of the combination labeled Band 39-Band 41, the first band pass filter is a Band 39 reception filter and the second band pass filter is a Band 41 reception filter. In addition, the ratio between f1 and f2 (f2/f1) is provided by the relationship illustrated in Table 4 for each Band combination. For example, when Band 39-Band 41 is used, f2/f1=1.365.

TABLE 4

| COMBINATION | f2L/f1 | f2/f1 | f2H/f1 |
|---|---|---|---|
| Band25-Band4 | 1.075 | 1.090 | 1.106 |
| Band4-Band30 | 1.098 | 1.098 | 1.103 |
| Band8-Band20 | 1.169 | 1.148 | 1.191 |
| Band7-Band40 | 1.115 | 1.130 | 1.145 |
| Band1-Band3 | 1.145 | 1.161 | 1.178 |
| Band3-Band66 | 1.145 | 1.170 | 1.194 |
| Band5-Band12 | 1.195 | 1.178 | 1.212 |
| Band5-Band13 | 1.174 | 1.157 | 1.190 |
| Band25-Band30 | 1.197 | 1.200 | 1.203 |
| Band66-Band41 | 1.158 | 1.203 | 1.248 |
| Band1-Band41 | 1.166 | 1.212 | 1.257 |
| Band66-Band7 | 1.216 | 1.232 | 1.248 |
| Band1-Band7 | 1.224 | 1.241 | 1.257 |
| Band4-Band7 | 1.224 | 1.241 | 1.257 |
| Band3-Band40 | 1.248 | 1.275 | 1.303 |
| Band25-Band41 | 1.272 | 1.321 | 1.371 |
| Band39-Band41 | 1.314 | 1.365 | 1.416 |
| Band1-Band21 | 1.403 | 1.423 | 1.443 |

TABLE 4-continued

| COMBINATION | f2L/f1 | f2/f1 | f2H/f1 |
|---|---|---|---|
| Band66-Band21 | 1.403 | 1.433 | 1.463 |
| Band1-Band11 | 1.420 | 1.440 | 1.460 |
| Band3-Band7 | 1.422 | 1.441 | 1.460 |
| Band66-Band11 | 1.420 | 1.450 | 1.481 |

The specific combination does not have to be selected from among the Bands listed in Table 4.

Furthermore, in the first preferred embodiment, f2 is the center frequency of the second pass band of the second reception filter 4, but loss degradation caused by a higher mode generated by the first reception filter 3a is able to be reduced or prevented across the entirety or substantially the entirety of the second pass band of the second reception filter 4 by shifting f1' further toward the low frequency side than the lower limit value of the second pass band of the second reception filter 4 (lowest frequency inside pass band).

Specifically, in the case in which f2L is the lower limit value of the frequencies of the second pass band of the second reception filter 4, the first metal film 23a made of Pt, and the Pt film thickness of about 0.5%, f1<f1'<f2L is able to be satisfied by setting x ($SiO_2$ film thickness) such that the following Formula (3) is satisfied.

$$f2L/f1 > 0.00000096 \times x^4 - 0.00011979 \times x^3 + 0.00535955 \times x^2 - 0.10212558 \times x + 1.91148793 \quad \text{Formula (3)}$$

Here, ratios between f2L and f1 (f2L/f1) for representative Band combinations are listed in Table 4, but a band combination does not have be selected from among the Bands listed in Table 4.

In preferred embodiments of the present invention, f1 and f2 have the relationship illustrated in Table 4, and in the case in which the first metal film 23a is made of a metal and has a film thickness as listed in Table 5 below, the value of x is determined such that y is smaller than f2/f1 in the formula illustrated in Table 5. At this time, f1, f1', and f2 satisfy f1<f1'<f2. y is f1'/f1. In addition, each film thickness is a percentage of a wavelength λ determined by the electrode finger pitch of the IDT electrode 23. Regarding the formulas illustrated in Table 5, for example, when 0.25%<Pt≤0.75%, an approximation obtained when Pt=0.5%, the central value, is illustrated, but it is confirmed that the same or substantially the same effect is obtained when 0.25%<Pt≤0.75%. The same is true for the other ranges. Here, in Table 5 below, x4 represents x to the power of 4, x3 represents x to the power of 3, and x2 represents x to the power of 2.

TABLE 5

| NORMALIZED FILM THICKNESS OF FIRST METAL FILM | |
|---|---|
| 0.25% < Pt ≤ 0.75% | y = 0.00000096 x4 − 0.00011979 x3 + 0.00535955 x2 − 0.10212558 x + 1.91148793 |
| 0.75% < Pt ≤ 1.25% | y = 0.00000091 x4 − 0.00011525 x3 + 0.00522036 x2 − 0.10069362 x + 1.93521887 |
| 1.25% < Pt ≤ 1.75% | y = 0.00000103 x4 − 0.00013182 x3 + 0.00602995 x2 − 0.11792508 x + 2.09489847 |
| 1.75% < Pt ≤ 2.25% | y = 0.00000109 x4 − 0.00014124 x3 + 0.00650460 x2 − 0.12836964 x + 2.20470460 |
| 2.25% < Pt ≤ 2.75% | y = 0.00000113 x4 − 0.00014692 x3 + 0.00680623 x2 − 0.13536545 x + 2.28964825 |
| 2.75% < Pt ≤ 3.25% | y = 0.00000111 x4 − 0.00014601 x3 + 0.00681451 x2 − 0.13665429 x + 2.33392938 |
| 3.25% < Pt ≤ 3.75% | y = 0.00000119 x4 − 0.00015728 x3 + 0.00737777 x2 − 0.14901122 x + 2.45977087 |

TABLE 5-continued

| NORMALIZED FILM THICKNESS OF FIRST METAL FILM | |
|---|---|
| 3.75% < Pt ≤ 4.25% | y = 0.00000123 x4 − 0.00016379 x3 + 0.00772873 x2 − 0.15723896 x + 2.55622092 |
| 4.25% < Pt ≤ 4.75% | y = 0.00000121 x4 − 0.00016214 x3 + 0.00769286 x2 − 0.15751557 x + 2.59312937 |
| 4.75% < Pt ≤ 5.25% | y = 0.00000174 x4 − 0.00022691 x3 + 0.01058009 x2 − 0.21389115 x + 3.02814932 |
| 5.25% < Pt ≤ 5.75% | y = 0.00000247 x4 − 0.00032401 x3 + 0.01528948 x2 − 0.31238987 x + 3.79970631 |
| 5.75% < Pt ≤ 6.25% | y = 0.00000196 x4 − 0.00026015 x3 + 0.01236721 x2 − 0.25465724 x + 3.40977449 |
| 6.25% < Pt ≤ 6.75% | y = 0.00000167 x4 − 0.00022169 x3 + 0.01050080 x2 − 0.21577253 x + 3.14097300 |
| 6.75% < Pt ≤ 7.25% | y = 0.00000167 x4 − 0.00022176 x3 + 0.01051467 x2 − 0.21651968 x + 3.17671777 |
| 7.25% < Pt ≤ 7.75% | y = 0.00000166 x4 − 0.00022134 x3 + 0.01050380 x2 − 0.21672919 x + 3.20799513 |
| 7.75% < Pt ≤ 8.25% | y = 0.00000150 x4 − 0.00020368 x3 + 0.00980313 x2 − 0.20524827 x + 3.16834265 |
| 8.25% < Pt ≤ 8.75% | y = 0.00000085 x4 − 0.00012074 x3 + 0.00592600 x2 − 0.12681719 x + 2.61288002 |
| 8.75% < Pt ≤ 9.25% | y = 0.00000111 x4 − 0.00015274 x3 + 0.00741930 x2 − 0.15748992 x + 2.87039438 |
| 9.25% < Pt ≤ 9.75% | y = 0.00000105 x4 − 0.00014596 x3 + 0.00710645 x2 − 0.15151217 x + 2.85463183 |
| 9.75% < Pt ≤ 10.25% | y = 0.00000100 x4 − 0.00013894 x3 + 0.00678214 x2 − 0.14528844 x + 2.83677788 |
| 10.25% < Pt ≤ 10.75% | y = 0.00000094 x4 − 0.00013176 x3 + 0.00644924 x2 − 0.13888705 x + 2.81740252 |
| 10.75% < Pt ≤ 11.25% | y = 0.00000057 x4 − 0.00008628 x3 + 0.00439990 x2 − 0.09911499 x + 2.55984107 |
| 0.5% < Mo ≤ 1.5% | y = 0.00000086 x4 − 0.00011477 x3 + 0.00547211 x2 − 0.11082241 x + 2.01030202 |
| 1.5% < Mo ≤ 2.5% | y = 0.00000069 x4 − 0.00009656 x3 + 0.00481601 x2 − 0.10151017 x + 1.98701155 |
| 2.5% < Mo ≤ 3.5% | y = 0.00000031 x4 − 0.00005031 x3 + 0.00275675 x2 − 0.06203059 x + 1.72906604 |
| 3.5% < Mo ≤ 4.5% | y = −0.00000013 x4 + 0.00000558 x3 + 0.00017119 x2 − 0.01044443 x + 1.37200658 |
| 4.5% < Mo ≤ 5.5% | y = −0.00000051 x4 + 0.00005558 x3 − 0.00219606 x2 + 0.03780068 x + 1.03279022 |
| 5.5% < Mo ≤ 6.5% | y = −0.00000080 x4 + 0.00009310 x3 − 0.00401794 x2 + 0.07571679 x + 0.76564163 |
| 6.5% < Mo ≤ 7.5% | y = −0.00000087 x4 + 0.00010545 x3 − 0.00468570 x2 + 0.09061546 x + 0.66729105 |
| 7.5% < Mo ≤ 8.5% | y = −0.00000082 x4 + 0.00010128 x3 − 0.00457852 x2 + 0.08976261 x + 0.68639844 |
| 8.5% < Mo ≤ 9.5% | y = −0.00000060 x4 + 0.00007497 x3 − 0.00342455 x2 + 0.06742932 x + 0.86713651 |
| 10.5% < Mo ≤ 11.5% | y = −0.00000017 x4 + 0.00002091 x3 − 0.00096441 x2 + 0.01844249 x + 1.24807166 |
| 11.5% < Mo ≤ 12.5% | y = −0.00000015 x4 + 0.00001931 x3 − 0.00090997 x2 + 0.01753506 x + 1.27433165 |
| 12.5% < Mo ≤ 13.5% | y = −0.00000006 x4 + 0.00000784 x3 − 0.00039201 x2 + 0.00714081 x + 1.37199243 |
| 13.5% < Mo ≤ 14.5% | y = −0.00000003 x4 + 0.00000446 x3 − 0.00024129 x2 + 0.00395507 x + 1.41813718 |
| 14.5% < Mo ≤ 15.5% | y = −0.00000003 x4 + 0.00000459 x3 − 0.00023227 x2 + 0.00312729 x + 1.45148162 |
| 15.5% < Mo ≤ 16.5% | y = −0.00000001 x4 + 0.00000191 x3 − 0.00009136 x2 + 0.00002123 x + 1.49026695 |
| 0.5% < Cu ≤ 1.5% | y = 0.00000094 x4 − 0.00012344 x3 + 0.00581143 x2 − 0.11657718 x + 2.04608446 |
| 1.5% < Cu ≤ 2.5% | y = 0.00000086 x4 − 0.00011414 x3 + 0.00544778 x2 − 0.11058405 x + 2.02873296 |
| 2.5% < Cu ≤ 3.5% | y = 0.00000084 x4 − 0.00011350 x3 + 0.00547226 x2 − 0.11227074 x + 2.06865985 |
| 3.5% < Cu ≤ 4.5% | y = 0.00000079 x4 − 0.00010821 x3 + 0.00528113 x2 − 0.10966931 x + 2.07776366 |
| 4.5% < Cu ≤ 5.5% | y = 0.00000071 x4 − 0.00009958 x3 + 0.00492704 x2 − 0.10365176 x + 2.06138291 |
| 5.5% < Cu ≤ 6.5% | y = 0.00000056 x4 − 0.00008097 x3 + 0.00409365 x2 − 0.08768311 x + 1.96982981 |
| 6.5% < Cu ≤ 7.5% | y = 0.00000027 x4 − 0.00004506 x3 + 0.00245191 x2 − 0.05526267 x + 1.75554360 |
| 7.5% < Cu ≤ 8.5% | y = 0.00000027 x4 − 0.00004406 x3 + 0.00240775 x2 − 0.05474153 x + 1.77586511 |
| 8.5% < Cu ≤ 9.5% | y = 0.00000012 x4 − 0.00002592 x3 + 0.00156151 x2 − 0.03786456 x + 1.67380321 |
| 10.5% < Cu ≤ 11.5% | y = −0.00000052 x4 + 0.00005229 x3 − 0.00191969 x2 + 0.02965533 x + 1.21335787 |
| 11.5% < Cu ≤ 12.5% | y = −0.00000038 x4 + 0.00003585 x3 − 0.00123786 x2 + 0.01692360 x + 1.32322464 |
| 12.5% < Cu ≤ 13.5% | y = −0.00000042 x4 + 0.00004404 x3 − 0.00172044 x2 + 0.02841565 x + 1.24656769 |
| 13.5% < Cu ≤ 14.5% | y = −0.00000014 x4 + 0.00000947 x3 − 0.00016487 x2 − 0.00253086 x + 1.49539433 |
| 14.5% < Cu ≤ 15.5% | y = −0.00000096 x4 + 0.00011425 x3 − 0.00507021 x2 + 0.09730729 x + 0.76978224 |
| 15.5% < Cu ≤ 16.5% | y = 0.00000007 x4 − 0.00001715 x3 + 0.00109352 x2 − 0.02884912 x + 1.73506674 |

In addition, in preferred embodiments of the present invention, f1 and f2 have the relationship illustrated in Table 4, and in the case in which the first metal film 23a is made of a metal and has a film thickness as illustrated in Table 5, the value of x is determined such that y is larger than f2/f1 in the formula illustrated in Table 5. At this time, f1, f1', and f2 satisfy f1<f2<f1'. In addition, each film thickness is a percentage of a wavelength λ determined by the electrode finger pitch of the IDT electrode 23.

It this manner, it is ensured that the second reception filter 4 is unlikely to be adversely affected by the Sezawa wave response of the first reception filter 3a by making f1' be at a different position from f2.

In particular, in the case in which the difference between f1 and f2 is large, it is sufficient to perform adjustment such that f1<f1'<f2. In addition, in the case in which the difference between f1 and f2 is small, it is preferable to perform adjustment such that f1<f2<f1'.

Hereafter, a case is specifically described in which the first reception filter 3a is a Band 25 reception filter and the second reception filter 4 is a Band 30 reception filter. The center frequency f1 of the Band 25 reception frequency band, which is the first pass band, is about 1962.5 MHz. In addition, the center frequency f2 of the Band 30 reception frequency band, which is the second pass band, is about 2355 MHz. Therefore, in the present preferred embodiment f2/f1=1.20. In this case, a case in which Pt is used for the first metal film 23a will be described as an example. When f1<f2<f1', 1<f2/f1<f1'/f1, and therefore it is necessary for about 1.20<f1'/f1 when f2/f1=1.20 is substituted. When a broken line f2/f1 denoted by B in FIG. 5 is 1.20, the region above (f1'/f1=1.20) is preferable in order to satisfy about 1.20<f1'/f1. Specifically, when the Pt film thickness is 2.0%, f1'/f1 is approximated by below Formula (4).

$$y = 0.00000109 xx^4 \times 0.00014124 xx^3 + 0.00650460 xx^2 - 0.12836964 xx + 2.20470460 \quad \text{Formula (4)}$$

Here, y is f1'/f1 and x is the SiO$_2$ film thickness. It is clear that f1<f2<f1' is satisfied when the conditions of the film thickness of the SiO$_2$ film and the Pt film thickness expressed by this relationship are in the region above f2/f1=f1'/f1=about 1.20, that is, by setting the Pt film thickness, which is the film thickness of the first metal film, and the SiO$_2$ film thickness so as to satisfy below Formula (5).

$$1.20 < 0.00000109 xx^4 - 0.00014124 xx^3 + 0.00650460 \times x^2 - 0.12836964 xx + 2.20470460 \quad \text{Formula (5)}$$

In the above specific example, the combination of a Band 25 reception filter and a Band 30 reception filter is used, but any of the Band combinations listed in Table 4 may be used instead, for example. In addition, a combination does not have to be selected from among the Bands listed in Table 4.

Furthermore, in the first preferred embodiment, f2 is the center frequency of the second pass band of the second reception filter 4, but loss degradation caused by a higher mode generated by the first reception filter 3a is able to be reduced or prevented across the entirety or substantially the entirety of the second pass band of the second reception filter 4 by shifting f1' further toward the high frequency side than the upper limit value of the second pass band of the second reception filter 4 (highest frequency inside pass band). In other words, in the case in which f2H is the upper limit value of the frequencies of the second pass band of the second reception filter 4, the IDT electrode is made of Pt, and the Pt film thickness is 2.0%, f1<f2H<f1' is able to be satisfied by setting the SiO$_2$ film thickness so as to satisfy the following Formula (6).

$$f2H/f1 < 0.00000109 \times x^4 - 0.00014124 \times x^3 + 0.00650460 \times x^2 - 0.12836964 \times x + 2.20470460 \quad \text{Formula (6)}$$

Here, ratios between f2H and f1 for representative Band combinations are listed in Table 4, but a band combination does not have be selected from among the Bands listed in Table 4.

Figure 6:
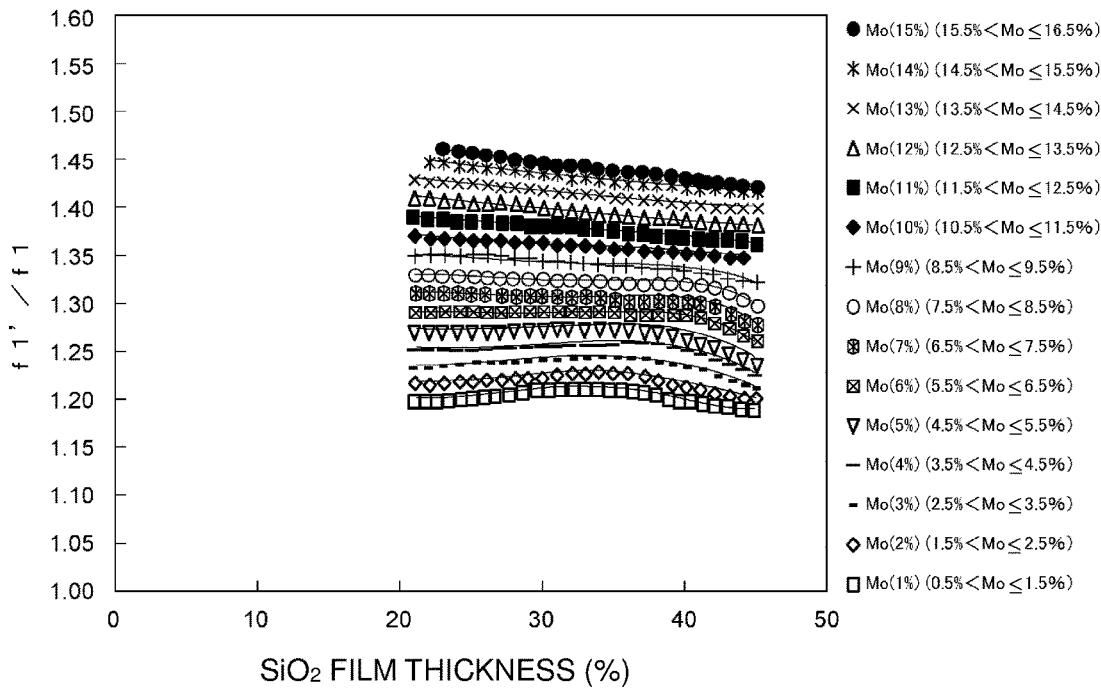
FIG. 6 is a diagram illustrating the relationship between SiO$_2$ film thickness and f1'/f1 when the film thickness of Mo, which is a first metal film, is changed.
Figure 7:
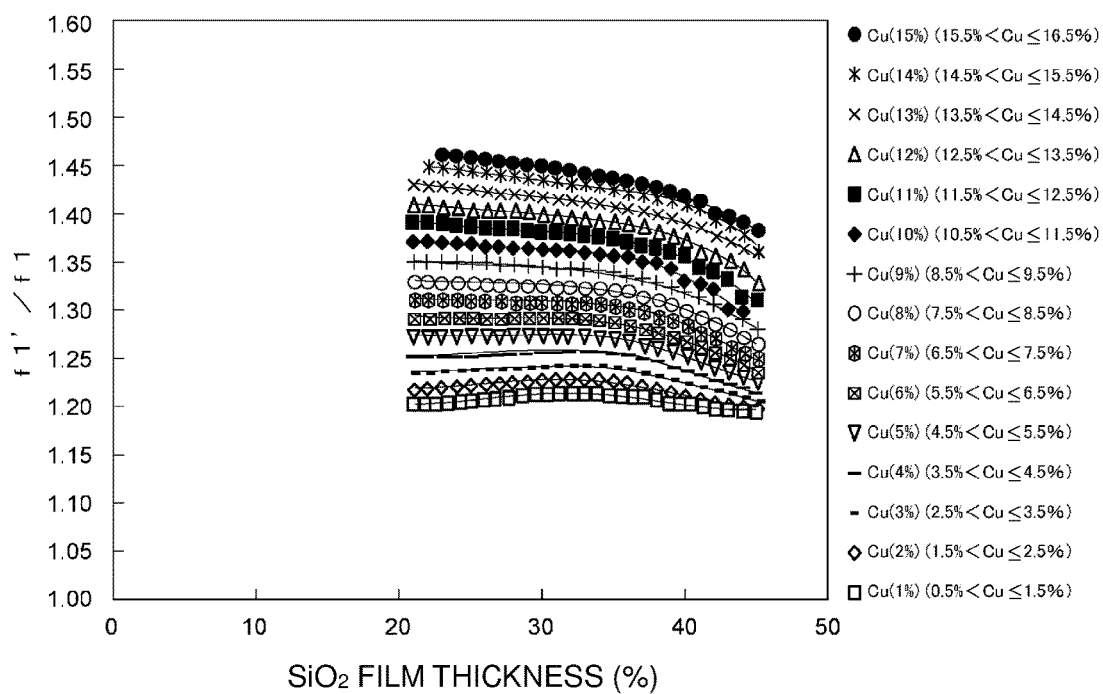
FIG. 7 is a diagram illustrating the relationship between SiO$_2$ film thickness and f1'/f1 when the film thickness of Cu, which is a first metal film, is changed.

Furthermore, although a case in which Pt is used for the first metal film 23a has been illustrated as an example in FIG. 5, f1' is able to be shifted to a different position from f2 also in cases in which Mo and Cu are used for the first metal film 23a by respectively referring to FIGS. 6 and 7.

Thus, in preferred embodiments of the present invention, it is clear that f1<f1'<f2 or f1<f2<f1' is satisfied by setting the film thicknesses of first metal film and the dielectric film as described above. Consequently, it is possible to ensure that the second band pass filter is unlikely to be adversely affected by the Sezawa wave response of the first band pass filter.

In the case in which a Sezawa wave has a plurality of responses or in the case in which a Sezawa wave is generated so as to have a band, the frequency f1' of the Sezawa wave is the frequency at which the reflection characteristic on the input terminal side is the largest.

Second Preferred Embodiment

Figure 8:
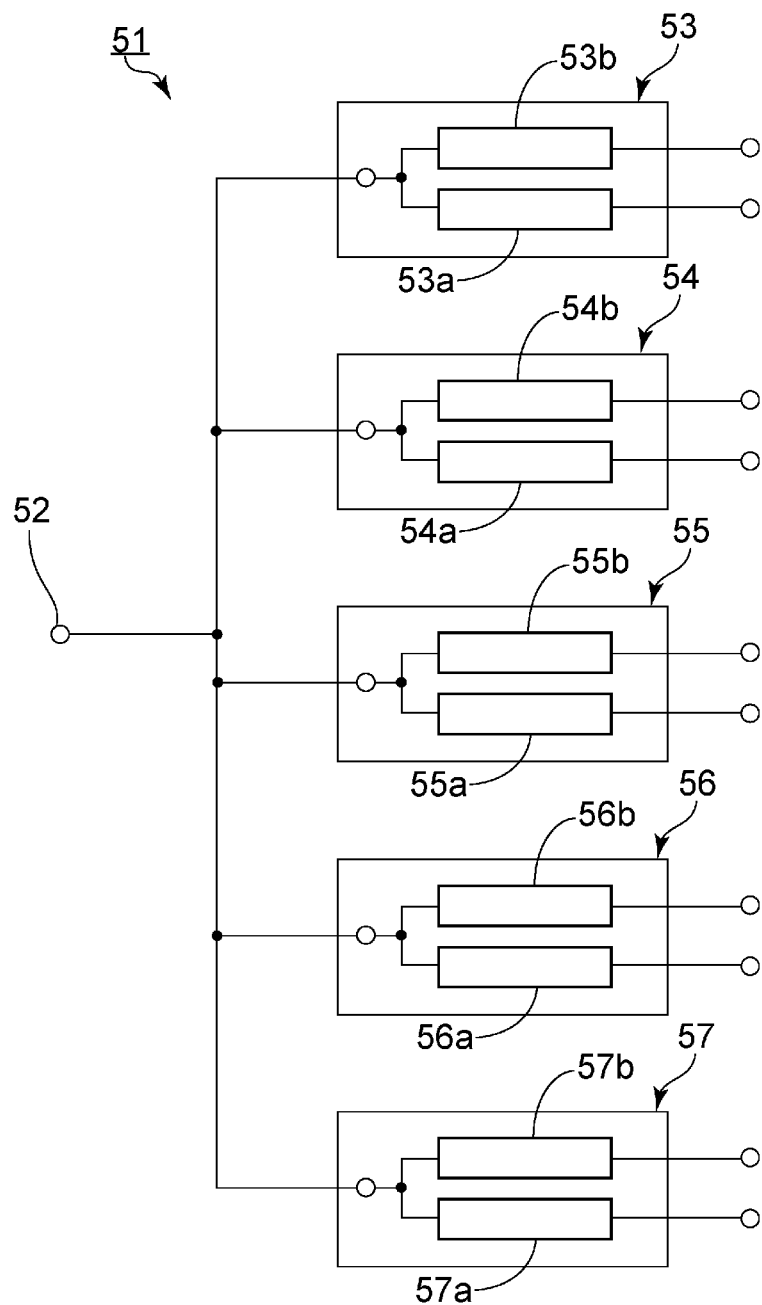
FIG. 8 is a schematic circuit diagram of a composite filter device according to a second preferred embodiment of the present invention.

FIG. 8 is a schematic circuit diagram of a composite filter device according to a second preferred embodiment of the present invention. A composite filter device 51 is used in carrier aggregation. The composite filter device 51 includes an antenna common terminal 52 that defines and functions as a common terminal. A plurality of composite filters 53 to 57 are connected to the antenna common terminal 52. The composite filters 53 to 57 respectively include reception filters 53a, 54a, 55a, 56a, and 57a and transmission filters 53b, 54b, 55b, 56b, and 57b. In the composite filter device 51, any of the reception filters 53a to 57a may preferably be a first band pass filter and at least one out of the remaining reception filters 53a to 57a or the transmission filters 53b to 57b may be a second band pass filter. Consequently, it is possible to ensure that the second band pass filter is unlikely to be adversely affected by the Sezawa wave response of the first band pass filter. In addition, in each of the composite filters 53 to 57, the communication band to which the pass band of the transmission filter belongs is different from the communication band to which pass band of the reception filter belongs.

In the first preferred embodiment and the second preferred embodiment, examples have been described in which a composite filter device includes a composite filter. Hereafter, a preferred embodiment of a composite filter device for carrier aggregation that does not include a composite filter will be described.

Third Preferred Embodiment

Figure 10:
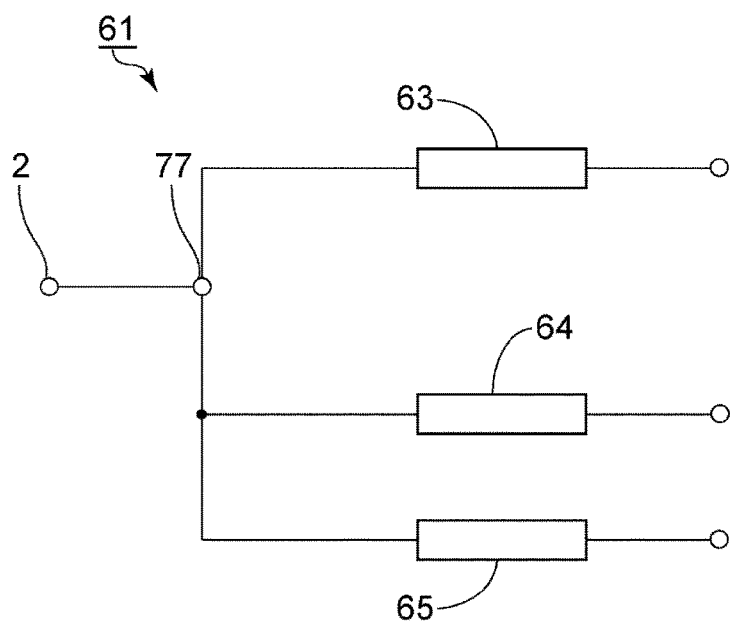
FIG. 10 is a schematic circuit diagram of a composite filter device according to a third preferred embodiment of the present invention.
Figure 11:
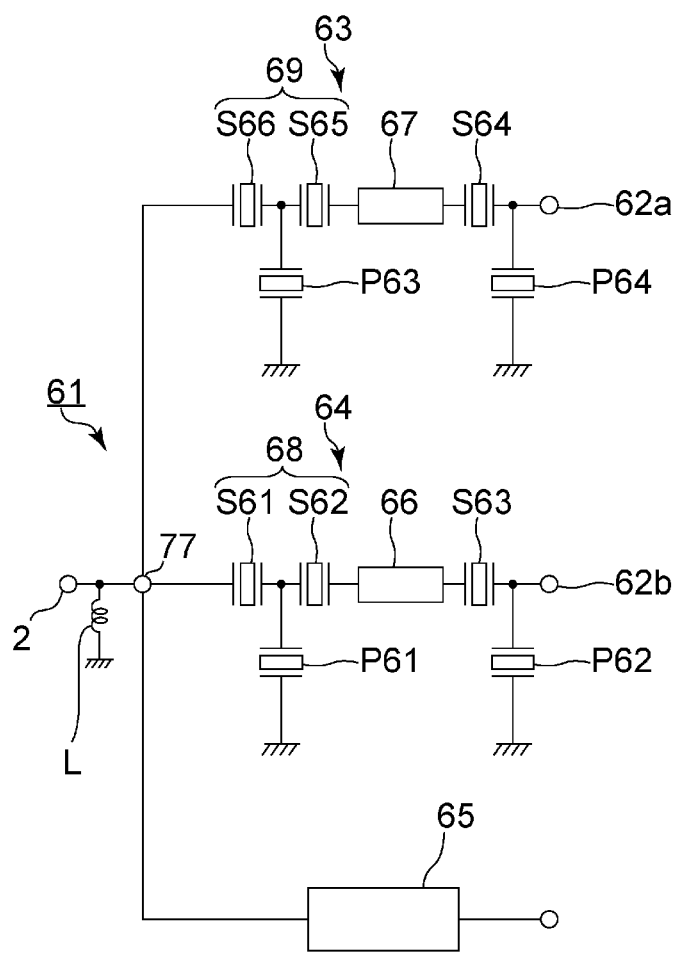
FIG. 11 is a circuit diagram illustrating a carrier aggregation circuit as an example of a carrier aggregation circuit defining a composite filter device of a preferred embodiment of the present invention.

FIG. 10 is a schematic circuit diagram of a composite filter device according to a third preferred embodiment of the present invention. FIG. 11 is a circuit diagram illustrating a carrier aggregation circuit as an example of a carrier aggregation circuit defining a composite filter device.

As described above, a carrier aggregation composite filter device 61 includes a first reception filter 63 and a second reception filter 64. The carrier aggregation composite filter device 61 includes a common terminal 77. The common terminal 77 is connected to an antenna common terminal 2. An impedance-matching inductor L is connected between the common terminal 77 and the ground potential.

The first reception filter 63 is connected between the common terminal 77 and a reception terminal 62a. The second reception filter 64 is connected between the common terminal 77 and a reception terminal 62b.

In the second reception filter 64, a ladder filter 68 is connected to the common terminal 77. The ladder filter 68 includes a plurality of series arm resonators S61 and S62 and a parallel arm resonator P61. The parallel arm resonator P61 is connected between a connection point between the series arm resonator S61 and the series arm resonator S62, and the ground potential. In addition, a longitudinally coupled resonator elastic wave filter 66 is connected to the side of the ladder filter 68 on the opposite side from the antenna common terminal 2. In the second reception filter 64, a pass band is defined by the longitudinally coupled resonator elastic wave filter 66 and the ladder filter 68.

In addition, a series arm resonator S63 is connected between the longitudinally coupled resonator elastic wave filter 66 and the reception terminal 62b. A parallel arm resonator P62 is connected between a connection point between the series arm resonator S63 and the reception terminal 62b, and the ground potential. The pass band is adjusted using the series arm resonator S63 and the parallel arm resonator P62.

In the first reception filter 63, a ladder filter 69 is connected to the common terminal 77. The ladder filter 69 includes series arm resonators S65 and S66 and a parallel arm resonator P63. In addition, a longitudinally coupled resonator elastic wave filter 67 is connected to the side of the ladder filter 69 on the opposite side from the antenna common terminal 2. In the first reception filter 63, a pass band is defined by the longitudinally coupled resonator elastic wave filter 67 and the ladder filter 69.

In addition, a series arm resonator S64 is connected between the longitudinally coupled resonator elastic wave filter 67 and the reception terminal 62a. A parallel arm resonator P64 is connected between a connection point between the series arm resonator S64 and the reception terminal 62a, and the ground potential. The pass band is adjusted using the series arm resonator S64 and the parallel arm resonator P64.

In FIG. 11, a third reception filter 65 is schematically illustrated as a block, but has the same or substantially the same configuration as the first reception filter 63.

In the composite filter device 61, all of the elastic wave resonators defining the series arm resonators S64 to S66, the parallel arm resonators P63 and P64, and the longitudinally coupled resonator elastic wave filter 67 are preferably defined by the specific elastic wave resonator as in the first preferred embodiment. Consequently, the insertion loss of the second reception filter 64 is unlikely to be degraded by the effect of the Sezawa wave response of the first reception filter 63.

Of course, it would be sufficient for at least one of the resonators defining the series arm resonators S64 to S66, the parallel arm resonators P63 and P64, and the longitudinally coupled resonator elastic wave filter 67 to be defined by the specific elastic wave resonator described above.

Degradation of insertion loss of the second reception filter caused by the Sezawa wave response of the first reception filter is particularly significant in a carrier aggregation composite filter device as in the present preferred embodiment. Therefore, in the present preferred embodiment, degradation of the insertion loss of the second reception filter 64 is particularly effectively reduced or prevented.

In preferred embodiments of the present invention, any one of a plurality of band pass filters connected to an antenna common terminal, which is a common terminal, may be a first band pass filter and at least one of the remaining band pass filters may be a second band pass filter. As long as there are a first band pass filter and a second band pass filter, the number of filters connected to the antenna common terminal is not particularly limited. In addition, an impedance-matching network may be provided between the antenna common terminal and the filters. The matching network may include an inductor, a capacitor, and other suitable elements, and may be connected in series with the filters or may be connected in parallel with the filters. Matching networks may be connected both in series and in parallel. In addition, the filters may be provided on the same chip.

As long as a composite filter device according to a preferred embodiment of the present invention includes first and second band pass filters that are connected to an antenna common terminal, the specific structure of the filter device is not particularly limited. Therefore, the composite filter device may be a multiplexer, a dual filter, or other suitable filter device, and may be used in a carrier aggregation circuit, a high-frequency front end circuit or a high-frequency front end module, a communication device, such as a cellular phone or a smart phone, or other suitable devices.

Figure 9:
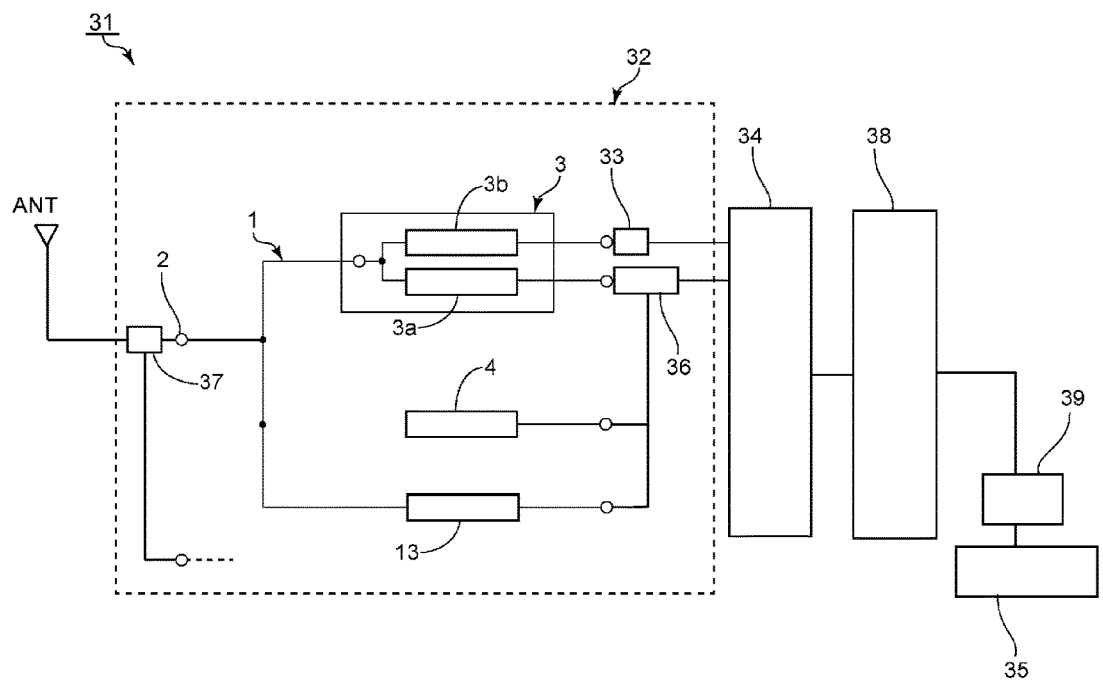
FIG. 9 is a schematic circuit diagram of a composite filter device, a high-frequency front end circuit, and a communication device according to a preferred embodiment of the present invention.

FIG. 9 is a schematic circuit diagram of a composite filter device, a high-frequency front end circuit, and a communication device according to a preferred embodiment of the present invention.

As illustrated in FIG. 9, a high-frequency front end circuit 32 includes the composite filter device 1 described above. A low noise amplifier (LNA) 36 and a switch (SW) 37 are connected to the composite filter device 1.

The high-frequency front end circuit 32 may include a diplexer, a circulator, an isolator, or other suitable components.

In addition, as illustrated in FIG. 9, a communication device 31 is, for example, a cellular phone, a smart phone, a vehicle-mounted communication device, a healthcare communication device, or other suitable communication device, and includes the high-frequency front end circuit 32, an RFIC 34, which is an RF stage IC, a base band IC (BBIC) 38, a CPU 39, and a display 35.

A power amplifier 33 and an LNA 36 are connected to the RFIC 34. In addition, the base band IC (BBIC) 38 is connected to the RFIC 34. The composite filter 3 is connected to the power amplifier 33 and the LNA 36. The composite filter 3 includes the reception filter 3a and the transmission filter 3b. The communication device 31 may include a plurality of the composite filters.

Thus, the high-frequency front end circuit 32 and the communication device 31 include the above-described composite filter device 1. In the composite filter device 1, the second band pass filter is unlikely to be adversely affected by the Sezawa wave response of the first band pass filter, and therefore, the high-frequency front end circuit 32 and the communication device 31 have excellent reliability.

Figure 12:
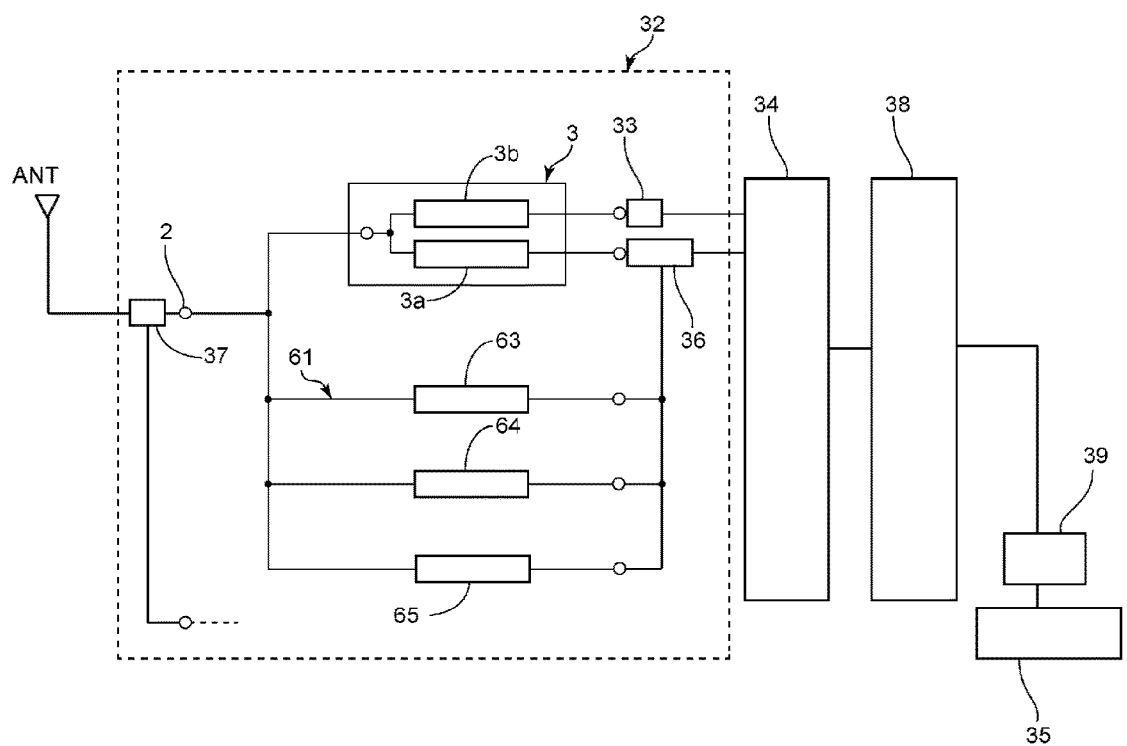
FIG. 12 is a schematic circuit diagram of a communication device according to a modification of the communication device illustrated in FIG. 9.

The communication device may include the composite filter device 61 according to the third preferred embodiment as a modification of the communication device that is illustrated in FIG. 12.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite filter device for use in carrier aggregation, the composite filter device comprising:
   an antenna common terminal that is connected to an antenna; and
   a plurality of band pass filters that are connected to the antenna common terminal and have different pass bands from each other; wherein
   the plurality of band pass filters include:
   a first band pass filter that has a first pass band;
   a second band pass filter that is connected to the antenna common terminal and has a second pass band located at higher frequencies than the first band pass filter;
   the first band pass filter includes an elastic wave resonator;
   the elastic wave resonator includes a $LiNbO_3$ substrate, an IDT electrode that is provided on the $LiNbO_3$ substrate, and a dielectric film that covers the IDT electrode on the $LiNbO_3$ substrate and includes a silicon oxide as a main component;
   the elastic wave resonator utilizes Rayleigh waves that propagate along the $LiNbO_3$ substrate; and
   when f1' is a frequency of a Sezawa wave of the first band pass filter and f2 is a center frequency of the second pass band, f1' is located at a different position from f2.

2. The composite filter device according to claim 1, wherein
   the IDT electrode includes a first metal film including one metal from among Pt, Mo, and Cu as a main component; and
   when f1 is a center frequency of the first pass band, y is f1'/f1, and x is a film thickness of the dielectric film, and the first metal film has a film thickness as listed in Table 1, y has a different value from f2/f1 in a formula provided in Table 1, where x4 represents x to the power of 4, x3 represents x to the power of 3, and x2 represents x to the power of 2

TABLE 1

| NORMALIZED FILM THICKNESS OF FIRST METAL FILM | |
|---|---|
| 0.25% < Pt ≤ 0.75% | y = 0.00000096 x4 − 0.00011979 x3 + 0.00535955 x2 − 0.10212558 x + 1.91148793 |
| 0.75% < Pt ≤ 1.25% | y = 0.00000091 x4 − 0.00011525 x3 + 0.00522036 x2 − 0.10069362 x + 1.93521887 |

TABLE 1-continued

| NORMALIZED FILM THICKNESS OF FIRST METAL FILM | |
|---|---|
| 1.25% < Pt ≤ 1.75% | y = 0.00000103 x4 − 0.00013182 x3 + 0.00602995 x2 − 0.11792508 x + 2.09489847 |
| 1.75% < Pt ≤ 2.25% | y = 0.00000109 x4 − 0.00014124 x3 + 0.00650460 x2 − 0.12836964 x + 2.20470460 |
| 2.25% < Pt ≤ 2.75% | y = 0.00000113 x4 − 0.00014692 x3 + 0.00680623 x2 − 0.13536545 x + 2.28964825 |
| 2.75% < Pt ≤ 3.25% | y = 0.00000111 x4 − 0.00014601 x3 + 0.00681451 x2 − 0.13665429 x + 2.33392938 |
| 3.25% < Pt ≤ 3.75% | y = 0.00000119 x4 − 0.00015728 x3 + 0.00737777 x2 − 0.14901122 x + 2.45977087 |
| 3.75% < Pt ≤ 4.25% | y = 0.00000123 x4 − 0.00016379 x3 + 0.00772873 x2 − 0.15723896 x + 2.55622092 |
| 4.25% < Pt ≤ 4.75% | y = 0.00000121 x4 − 0.00016214 x3 + 0.00769286 x2 − 0.15751557 x + 2.59312937 |
| 4.75% < Pt ≤ 5.25% | y = 0.00000174 x4 − 0.00022691 x3 + 0.01058009 x2 − 0.21389115 x + 3.02814932 |
| 5.25% < Pt ≤ 5.75% | y = 0.00000247 x4 − 0.00032401 x3 + 0.01528948 x2 − 0.31238987 x + 3.79970631 |
| 5.75% < Pt ≤ 6.25% | y = 0.00000196 x4 − 0.00026015 x3 + 0.01236721 x2 − 0.25465724 x + 3.40977449 |
| 6.25% < Pt ≤ 6.75% | y = 0.00000167 x4 − 0.00022169 x3 + 0.01050080 x2 − 0.21577253 x + 3.14097300 |
| 6.75% < Pt ≤ 7.25% | y = 0.00000167 x4 − 0.00022176 x3 + 0.01051467 x2 − 0.21651968 x + 3.17671777 |
| 7.25% < Pt ≤ 7.75% | y = 0.00000166 x4 − 0.00022134 x3 + 0.01050380 x2 − 0.21672919 x + 3.20799513 |
| 7.75% < Pt ≤ 8.25% | y = 0.00000150 x4 − 0.00020368 x3 + 0.00980313 x2 − 0.20524827 x + 3.16834265 |
| 8.25% < Pt ≤ 8.75% | y = 0.00000085 x4 − 0.00012074 x3 + 0.00592600 x2 − 0.12681719 x + 2.61288002 |
| 8.75% < Pt 9.25% | y = 0.00000111 x4 − 0.00015274 x3 + 0.00741930 x2 − 0.15748992 x + 2.87039438 |
| 9.25% < Pt 9.75% | y = 0.00000105 x4 − 0.00014596 x3 + 0.00710645 x2 − 0.15151217 x + 2.85463183 |
| 9.75% < Pt 10.25% | y = 0.00000100 x4 − 0.00013894 x3 + 0.00678214 x2 − 0.14528844 x + 2.83677788 |
| 10.25% < Pt ≤ 10.75% | y = 0.00000094 x4 − 0.00013176 x3 + 0.00644924 x2 − 0.13888705 x + 2.81740252 |
| 10.75% < Pt ≤ 11.25% | y = 0.00000057 x4 − 0.00008628 x3 + 0.00439990 x2 − 0.09911499 x + 2.55984107 |
| 0.5% < Mo ≤ 1.5% | y = 0.00000086 x4 − 0.00011477 x3 + 0.00547211 x2 − 0.11082241 x + 2.01030202 |
| 1.5% < Mo ≤ 2.5% | y = 0.00000069 x4 − 0.00009656 x3 + 0.00481601 x2 − 0.10151017 x + 1.98701155 |
| 2.5% < Mo ≤ 3.5% | y = 0.00000031 x4 − 0.00005031 x3 + 0.00275675 x2 − 0.06203059 x + 1.72906604 |
| 3.5% < Mo ≤ 4.5% | y = −0.00000013 x4 + 0.00000558 x3 + 0.00017119 x2 − 0.01044443 x + 1.37200658 |
| 4.5% < Mo ≤ 5.5% | y = −0.00000051 x4 + 0.00005558 x3 − 0.00219606 x2 + 0.03780068 x + 1.03279102 |
| 5.5% < Mo ≤ 6.5% | y = −0.00000080 x4 + 0.00009310 x3 − 0.00401794 x2 + 0.07571679 x + 0.76564163 |
| 6.5% < Mo ≤ 7.5% | y = −0.00000087 x4 + 0.00010545 x3 − 0.00468570 x2 + 0.09061546 x + 0.66729105 |
| 7.5% < Mo ≤ 8.5% | y = −0.00000082 x4 + 0.00010128 x3 − 0.00457852 x2 + 0.08976261 x + 0.68639844 |
| 8.5% < Mo ≤ 9.5% | y = −0.00000060 x4 + 0.00007497 x3 − 0.00342455 x2 + 0.06742932 x + 0.86713651 |
| 10.5% < Mo ≤ 11.5% | y = −0.00000017 x4 + 0.00002091 x3 − 0.00096441 x2 + 0.01844249 x + 1.24807166 |
| 11.5% < Mo ≤ 12.5% | y = −0.00000015 x4 + 0.00001931 x3 − 0.00090997 x2 + 0.01753506 x + 1.27433165 |
| 12.5% < Mo ≤ 13.5% | y = −0.00000006 x4 + 0.00000784 x3 − 0.00039201 x2 + 0.00714081 x + 1.37199243 |
| 13.5% < Mo ≤ 14.5% | y = −0.00000003 x4 + 0.00000446 x3 − 0.00024129 x2 + 0.00395507 x + 1.41813718 |
| 14.5% < Mo ≤ 15.5% | y = −0.00000003 x4 + 0.00000459 x3 − 0.00023227 x2 + 0.00312729 x + 1.45148162 |
| 15.5% < Mo ≤ 16.5% | y = −0.00000001 x4 + 0.00000191 x3 − 0.00009136 x2 + 0.00002123 x + 1.49026695 |
| 0.5% < Cu ≤ 1.5% | y = 0.00000094 x4 − 0.00012344 x3 + 0.00581143 x2 − 0.11657718 x + 2.04608446 |
| 1.5% < Cu ≤ 2.5% | y = 0.00000086 x4 − 0.00011414 x3 + 0.00544778 x2 − 0.11058405 x + 2.02873296 |
| 2.5% < Cu ≤ 3.5% | y = 0.00000084 x4 − 0.00011350 x3 + 0.00547226 x2 − 0.11227974 x + 2.06865985 |
| 3.5% < Cu ≤ 4.5% | y = 0.00000079 x4 − 0.00010821 x3 + 0.00528113 x2 − 0.10966931 x + 2.07776366 |
| 4.5% < Cu ≤ 5.5% | y = 0.00000071 x4 − 0.00009958 x3 + 0.00492704 x2 − 0.10365176 x + 2.06138291 |
| 5.5% < Cu ≤ 6.5% | y = 0.00000056 x4 − 0.00008097 x3 + 0.00409365 x2 − 0.08768311 x + 1.96982981 |
| 6.5% < Cu ≤ 7.5% | y = 0.00000027 x4 − 0.00004506 x3 + 0.00245191 x2 − 0.05526267 x + 1.75554360 |
| 7.5% < Cu ≤ 8.5% | y = 0.00000027 x4 − 0.00004406 x3 + 0.00240775 x2 − 0.05474153 x + 1.77586511 |
| 8.5% < Cu ≤ 9.5% | y = 0.00000012 x4 − 0.00002592 x3 + 0.00156151 x2 − 0.03786456 x + 1.67380321 |
| 10.5% < Cu ≤ 11.5% | y = −0.00000052 x4 + 0.00005229 x3 − 0.00191969 x2 + 0.02965533 x + 1.21335787 |
| 11.5% < Cu ≤ 12.5% | y = −0.00000038 x4 + 0.00003585 x3 − 0.00123786 x2 + 0.01692360 x + 1.32322464 |
| 12.5% < Cu ≤ 13.5% | y = −0.00000042 x4 + 0.00004404 x3 − 0.00172044 x2 + 0.02841565 x + 1.24656769 |
| 13.5% < Cu ≤ 14.5% | y = −0.00000014 x4 + 0.00000947 x3 − 0.00016487 x2 − 0.00253086 x + 1.49539433 |
| 14.5% < Cu ≤ 15.5% | y = −0.00000096 x4 + 0.00011425 x3 − 0.00507021 x2 + 0.09730729 x + 0.76978224 |
| 15.5% < Cu ≤ 16.5% | y = 0.00000007 x4 − 0.00001715 x3 + 0.00109352 x2 − 0.02884912 x + 1.73506674. |

3. The composite filter device according to claim 2, wherein
the IDT electrode includes a first metal film including one metal from among Pt, Mo, and Cu as a main component; and
when y is f1′/f1, x is a film thickness of the dielectric film, f2L is a lower limit value of frequencies of the second pass band, and the first metal film has a film thickness as listed in Table 2, y is smaller than f2L/f1 in a formula illustrated in Table 2, where x4 represents x to the power of 4, x3 represents x to the power of 3, and x2 represents x to the power of 2

TABLE 2

| NORMALIZED FILM THICKNESS OF FIRST METAL FILM | |
|---|---|
| 0.25% < Pt ≤ 0.75% | y = 0.00000096 x4 − 0.00011979 x3 + 0.00535955 x2 − 0.10212558 x + 1.91148793 |
| 0.75% < Pt ≤ 1.25% | y = 0.00000091 x4 − 0.00011525 x3 + 0.00522036 x2 − 0.10069362 x + 1.93521887 |
| 1.25% < Pt ≤ 1.75% | y = 0.00000103 x4 − 0.00013182 x3 + 0.00602995 x2 − 0.11792508 x + 2.09489847 |
| 1.75% < Pt ≤ 2.25% | y = 0.00000109 x4 − 0.00014124 x3 + 0.00650460 x2 − 0.12836964 x + 2.20470460 |
| 2.25% < Pt ≤ 2.75% | y = 0.00000113 x4 − 0.00014692 x3 + 0.00680623 x2 − 0.13536545 x + 2.28964825 |
| 2.75% < Pt ≤ 3.25% | y = 0.00000111 x4 − 0.00014601 x3 + 0.00681451 x2 − 0.13665429 x + 2.33392938 |
| 3.25% < Pt ≤ 3.75% | y = 0.00000119 x4 − 0.00015728 x3 + 0.00737777 x2 − 0.14901122 x + 2.45977087 |
| 3.75% < Pt ≤ 4.25% | y = 0.00000123 x4 − 0.00016379 x3 + 0.00772873 x2 − 0.15723896 x + 2.55622092 |
| 4.25% < Pt ≤ 4.75% | y = 0.00000121 x4 − 0.00016214 x3 + 0.00769286 x2 − 0.15751557 x + 2.59312937 |
| 4.75% < Pt ≤ 5.25% | y = 0.00000174 x4 − 0.00022691 x3 + 0.01058009 x2 − 0.21389115 x + 3.02814932 |
| 5.25% < Pt ≤ 5.75% | y = 0.00000247 x4 − 0.00032401 x3 + 0.01528948 x2 − 0.31238987 x + 3.79970631 |
| 5.75% < Pt ≤ 6.25% | y = 0.00000196 x4 − 0.00026015 x3 + 0.01236721 x2 − 0.25465724 x + 3.40977449 |
| 6.25% < Pt ≤ 6.75% | y = 0.00000167 x4 − 0.00022169 x3 + |

TABLE 2-continued

| NORMALIZED FILM THICKNESS OF FIRST METAL FILM | |
|---|---|
| | $0.01050080\ x2 - 0.21577253\ x + 3.14097300$ |
| $6.75\% < Pt \le 7.25\%$ | $y = 0.00000167\ x4 - 0.00022176\ x3 + 0.01051467\ x2 - 0.21651968\ x + 3.17671777$ |
| $7.25\% < Pt \le 7.75\%$ | $y = 0.00000166\ x4 - 0.00022134\ x3 + 0.01050380\ x2 - 0.21672919\ x + 3.20799513$ |
| $7.75\% < Pt \le 8.25\%$ | $y = 0.00000150\ x4 - 0.00020368\ x3 + 0.00980313\ x2 - 0.20524827\ x + 3.16834265$ |
| $8.25\% < Pt \le 8.75\%$ | $y = 0.00000085\ x4 - 0.00012074\ x3 + 0.00592600\ x2 - 0.12681719\ x + 2.61288002$ |
| $8.75\% < Pt \le 9.25\%$ | $y = 0.00000111\ x4 - 0.00015274\ x3 + 0.00741930\ x2 - 0.15748992\ x + 2.87039438$ |
| $9.25\% < Pt \le 9.75\%$ | $y = 0.00000105\ x4 - 0.00014596\ x3 + 0.00710645\ x2 - 0.15151217\ x + 2.85463183$ |
| $9.75\% < Pt \le 10.25\%$ | $y = 0.00000100\ x4 - 0.00013894\ x3 + 0.00678214\ x2 - 0.14528844\ x + 0.83677788$ |
| $10.25\% < Pt \le 10.75\%$ | $y = 0.00000094\ x4 - 0.00013176\ x3 + 0.00644924\ x2 - 0.13888705\ x + 2.81740252$ |
| $10.75\% < Pt \le 11.25\%$ | $y = 0.00000057\ x4 - 0.00008628\ x3 + 0.00439990\ x2 - 0.09911499\ x + 2.55984107$ |
| $0.5\% < Mo \le 1.5\%$ | $y = 0.00000086\ x4 - 0.00011477\ x3 + 0.00547211\ x2 - 0.11082241\ x + 2.01030202$ |
| $1.5\% < Mo \le 2.5\%$ | $y = 0.00000069\ x4 - 0.00009656\ x3 + 0.00481601\ x2 - 0.10151017\ x + 1.98701155$ |
| $2.5\% < Mo \le 3.5\%$ | $y = 0.00000031\ x4 - 0.00005031\ x3 + 0.00275675\ x2 - 0.06203059\ x + 1.72906604$ |
| $3.5\% < Mo \le 4.5\%$ | $y = -0.00000013\ x4 + 0.00000558\ x3 + 0.00017119\ x2 - 0.01044443\ x + 1.37200658$ |
| $4.5\% < Mo \le 5.5\%$ | $y = -0.00000051\ x4 + 0.00005558\ x3 - 0.00219606\ x2 + 0.03780068\ x + 1.03279022$ |
| $5.5\% < Mo \le 6.5\%$ | $y = -0.00000080\ x4 + 0.00009310\ x3 - 0.00401794\ x2 + 0.07571679\ x + 0.76564163$ |
| $6.5\% < Mo \le 7.5\%$ | $y = -0.00000087\ x4 + 0.00010545\ x3 - 0.00468570\ x2 + 0.09061546\ x + 0.66729105$ |
| $7.5\% < Mo \le 8.5\%$ | $y = -0.00000082\ x4 + 0.00010128\ x3 - 0.00457852\ x2 + 0.08976261\ x + 0.68639844$ |
| $8.5\% < Mo \le 9.5\%$ | $y = -0.00000060\ x4 + 0.00007497\ x3 - 0.00342455\ x2 + 0.06742932\ x + 0.86713651$ |
| $10.5\% < Mo \le 11.5\%$ | $y = -0.00000017\ x4 + 0.00002091\ x3 - 0.00096441\ x2 + 0.01844249\ x + 1.24807166$ |
| $11.5\% < Mo \le 12.5\%$ | $y = -0.00000015\ x4 + 0.00001931\ x3 - 0.00090997\ x2 + 0.01753506\ x + 1.27433165$ |
| $12.5\% < Mo \le 13.5\%$ | $y = -0.00000004\ x4 + 0.00000784\ x3 - 0.00039201\ x2 + 0.00714081\ x + 1.37199243$ |
| $13.5\% < Mo \le 14.5\%$ | $y = -0.00000003\ x4 + 0.00000446\ x3 - 0.00024129\ x2 + 0.00395507\ x + 1.41813718$ |
| $14.5\% < Mo \le 15.5\%$ | $y = -0.00000004\ x4 + 0.00000459\ x3 - 0.00023227\ x2 + 0.00312729\ x + 1.45148162$ |
| $15.5\% < Mo \le 16.5\%$ | $y = -0.00000001\ x4 + 0.00000191\ x3 - 0.00009136\ x2 + 0.00002123\ x + 1.49026695$ |
| $0.5\% < Cu \le 1.5\%$ | $y = 0.00000094\ x4 - 0.00012344\ x3 + 0.00581143\ x2 - 0.11657718\ x + 2.04608446$ |
| $1.5\% < Cu \le 2.5\%$ | $y = 0.00000086\ x4 - 0.00011414\ x3 + 0.00544778\ x2 - 0.11058405\ x + 2.02873296$ |
| $2.5\% < Cu \le 3.5\%$ | $y = 0.00000084\ x4 - 0.00011350\ x3 + 0.00547226\ x2 - 0.11227974\ x + 2.06865985$ |
| $3.5\% < Cu \le 4.5\%$ | $y = 0.00000079\ x4 - 0.00010821\ x3 + 0.00528113\ x2 - 0.10966931\ x + 2.07776366$ |
| $4.5\% < Cu \le 5.5\%$ | $y = 0.00000071\ x4 - 0.00009958\ x3 + 0.00492704\ x2 - 0.10365176\ x + 2.06138291$ |
| $5.5\% < Cu \le 6.5\%$ | $y = 0.00000056\ x4 - 0.00008097\ x3 + 0.00409365\ x2 - 0.08768311\ x + 1.96982981$ |
| $6.5\% < Cu \le 7.5\%$ | $y = 0.00000027\ x4 - 0.00004506\ x3 + 0.00245191\ x2 - 0.05526267\ x + 1.75554360$ |
| $7.5\% < Cu \le 8.5\%$ | $y = 0.00000027\ x4 - 0.00004406\ x3 + 0.00240775\ x2 - 0.05474153\ x + 1.77586511$ |
| $8.5\% < Cu \le 9.5\%$ | $y = 0.00000012\ x4 - 0.00002592\ x3 + 0.00156151\ x2 - 0.03786456\ x + 1.67380321$ |
| $10.5\% < Cu \le 11.5\%$ | $y = -0.00000052\ x4 + 0.00005229\ x3 - 0.00191969\ x2 + 0.02965533\ x + 1.21335787$ |
| $11.5\% < Cu \le 12.5\%$ | $y = -0.00000038\ x4 + 0.00003585\ x3 - 0.00123786\ x2 + 0.01692360\ x + 1.32322464$ |
| $12.5\% < Cu \le 13.5\%$ | $y = -0.00000042\ x4 + 0.00004404\ x3 - 0.00172044\ x2 + 0.02841565\ x + 1.24656769$ |
| $13.5\% < Cu \le 14.5\%$ | $y = -0.00000014\ x4 + 0.00000947\ x3 - 0.00016487\ x2 - 0.00253086\ x + 1.49539433$ |
| $14.5\% < Cu \le 15.5\%$ | $y = -0.00000096\ x4 + 0.00011425\ x3 - 0.00507021\ x2 + 0.09730729\ x + 0.76978224$ |

4. The composite filter device according to claim 2, wherein
the IDT electrode includes a first metal film including one metal from among Pt, Mo, and Cu as a main component; and
when y is f1'/f1, x is a film thickness of the dielectric film, f2H is an upper limit value of frequencies of the second pass band, and the first metal film has a film thickness as listed in Table 3, y is larger than f2H/f1 in a formula illustrated in Table 3, where x4 represents x to the power of 4, x3 represents x to the power of 3, and x2 represents x to the power of 2

TABLE 3

| NORMALIZED FILM THICKNESS OF FIRST METAL FILM | |
|---|---|
| $0.25\% < Pt \le 0.75\%$ | $y = 0.00000096\ x4 - 0.00011979\ x3 + 0.00535955\ x2 - 0.10212558\ x + 1.91148793$ |
| $0.75\% < Pt \le 1.25\%$ | $y = 0.00000091\ x4 - 0.00011525\ x3 + 0.00522036\ x2 - 0.10069362\ x + 1.93521887$ |
| $1.25\% < Pt \le 1.75\%$ | $y = 0.00000103\ x4 - 0.00013182\ x3 + 0.00602995\ x2 - 0.11792508\ x + 2.09489847$ |
| $1.75\% < Pt \le 2.25\%$ | $y = 0.00000109\ x4 - 0.00014124\ x3 + 0.00650460\ x2 - 0.12836964\ x + 2.20470460$ |
| $2.25\% < Pt \le 2.75\%$ | $y = 0.00000113\ x4 - 0.00014692\ x3 + 0.00680623\ x2 - 0.13536545\ x + 2.28964825$ |
| $2.75\% < Pt \le 3.25\%$ | $y = 0.00000111\ x4 - 0.00014601\ x3 + 0.00681451\ x2 - 0.13665429\ x + 2.33392938$ |
| $3.25\% < Pt \le 3.75\%$ | $y = 0.00000119\ x4 - 0.00015728\ x3 + 0.00737777\ x2 - 0.14901122\ x + 2.45977087$ |
| $3.75\% < Pt \le 4.25\%$ | $y = 0.00000123\ x4 - 0.00016379\ x3 + 0.00772873\ x2 - 0.15723896\ x + 2.55622092$ |
| $4.25\% < Pt \le 4.75\%$ | $y = 0.00000121\ x4 - 0.00016214\ x3 + 0.00769286\ x2 - 0.15751557\ x + 2.59312937$ |
| $4.75\% < Pt \le 5.25\%$ | $y = 0.00000174\ x4 - 0.00022691\ x3 + 0.01058009\ x2 - 0.21389115\ x + 3.02814932$ |
| $5.25\% < Pt \le 5.75\%$ | $y = 0.00000247\ x4 - 0.00032401\ x3 + 0.01528948\ x2 - 0.31238987\ x + 3.79970631$ |
| $5.75\% < Pt \le 6.25\%$ | $y = 0.00000196\ x4 - 0.00026015\ x3 + 0.01236721\ x2 - 0.25465724\ x + 3.40977449$ |
| $6.25\% < Pt \le 6.75\%$ | $y = 0.00000167\ x4 - 0.00022169\ x3 + 0.01050080\ x2 - 0.21577253\ x + 3.14097300$ |
| $6.75\% < Pt \le 7.25\%$ | $y = 0.00000167\ x4 - 0.00022176\ x3 + 0.01051467\ x2 - 0.21651968\ x + 3.17671777$ |
| $7.25\% < Pt \le 7.75\%$ | $y = 0.00000166\ x4 - 0.00022134\ x3 + 0.01050380\ x2 - 0.21672919\ x + 3.20799513$ |
| $7.75\% < Pt \le 8.25\%$ | $y = 0.00000150\ x4 - 0.00020368\ x3 + 0.00980313\ x2 - 0.20524827\ x + 3.16834265$ |
| $8.25\% < Pt \le 8.75\%$ | $y = 0.00000085\ x4 - 0.00012074\ x3 + 0.00592600\ x2 - 0.12681719\ x + 2.61288002$ |
| $8.75\% < Pt \le 9.25\%$ | $y = 0.00000111\ x4 - 0.00015274\ x3 + 0.00741930\ x2 - 0.15748992\ x + 2.87039438$ |
| $9.25\% < Pt \le 9.75\%$ | $y = 0.00000105\ x4 - 0.00014596\ x3 + 0.00710645\ x2 - 0.15151217\ x + 2.85463183$ |
| $9.75\% < Pt \le 10.25\%$ | $y = 0.00000100\ x4 - 0.00013894\ x3 + 0.00678214\ x2 - 0.14528844\ x + 2.83677788$ |
| $10.25\% < Pt \le 10.75\%$ | $y = 0.00000094\ x4 - 0.00013176\ x3 + 0.00644924\ x2 - 0.13888705\ x + 2.81740252$ |
| $10.75\% < Pt \le 11.25\%$ | $y = 0.00000057\ x4 - 0.00008628\ x3 + 0.00439990\ x2 - 0.09911499\ x + 2.55984107$ |
| $0.5\% < Mo \le 1.5\%$ | $y = 0.00000086\ x4 - 0.00011477\ x3 + 0.00547211\ x2 - 0.11082241\ x + 2.01030202$ |
| $1.5\% < Mo \le 2.5\%$ | $y = 0.00000069\ x4 - 0.00009656\ x3 + 0.00481601\ x2 - 0.10151017\ x + 1.98701155$ |

TABLE 3-continued

| NORMALIZED FILM THICKNESS OF FIRST METAL FILM | |
|---|---|
| 2.5% < Mo ≤ 3.5% | y = 0.00000031 x4 − 0.00005031 x3 + 0.00275675 x2 − 0.06203059 x + 1.72906604 |
| 3.5% < Mo ≤ 4.5% | y = −0.00000013 x4 + 0.00000558 x3 + 0.00017119 x2 − 0.01044443 x + 1.37200658 |
| 4.5% < Mo ≤ 5.5% | y = −0.00000051 x4 + 0.00005558 x3 − 0.00219606 x2 + 0.03780068 x + 1.03279022 |
| 5.5% < Mo ≤ 6.5% | y = −0.00000080 x4 + 0.00009310 x3 − 0.00401794 x2 + 0.07571679 x + 0.76564163 |
| 6.5% < Mo ≤ 7.5% | y = −0.00000087 x4 + 0.00010545 x3 − 0.00468570 x2 + 0.09061546 x + 0.66729105 |
| 7.5% < Mo ≤ 8.5% | y = −0.00000082 x4 + 0.00010128 x3 − 0.00457852 x2 + 0.08976261 x + 0.68639844 |
| 8.5% < Mo ≤ 9.5% | y = −0.00000060 x4 + 0.00007497 x3 − 0.00342455 x2 + 0.06742932 x + 0.86713651 |
| 10.5% < Mo ≤ 11.5% | y = −0.00000017 x4 + 0.00002091 x3 − 0.00096441 x2 + 0.01844249 x + 1.24807166 |
| 11.5% < Mo ≤ 12.5% | y = −0.00000015 x4 + 0.00001931 x3 − 0.00090997 x2 + 0.01753506 x + 1.27433165 |
| 12.5% < Mo ≤ 13.5% | y = −0.00000006 x4 + 0.00000784 x3 − 0.00039201 x2 + 0.00714081 x + 1.37199243 |
| 13.5% < Mo ≤ 14.5% | y = −0.00000003 x4 + 0.00000446 x3 − 0.00024129 x2 + 0.00395507 x + 1.41813718 |
| 14.5% < Mo ≤ 15.5% | y = −0.00000003 x4 + 0.00000459 x3 − 0.00023227 x2 + 0.00312729 x + 1.45148162 |
| 15.5% < Mo ≤ 16.5% | y = −0.00000001 x4 + 0.00000191 x3 − 0.00009136 x2 + 0.00002123 x + 1.49026695 |
| 0.5% < Cu ≤ 1.5% | y = 0.00000094 x4 − 0.00012344 x3 + 0.00581143 x2 − 0.11657718 x + 2.04608446 |
| 1.5% < Cu ≤ 2.5% | y = 0.00000086 x4 − 0.00011414 x3 + 0.00544778 x2 − 0.11058405 x + 2.02873296 |
| 2.5% < Cu ≤ 3.5% | y = 0.00000084 x4 − 0.00011350 x3 + 0.00547226 x2 − 0.11227974 x + 2.06865985 |
| 3.5% < Cu ≤ 4.5% | y = 0.00000079 x4 − 0.00010821 x3 + 0.00528113 x2 − 0.10966931 x + 2.07776366 |
| 4.5% < Cu ≤ 5.5% | y = 0.00000071 x4 − 0.00009958 x3 + 0.00492704 x2 − 0.10365176 x + 2.06138291 |
| 5.5% < Cu ≤ 6.5% | y = 0.00000056 x4 − 0.00008097 x3 + 0.00409365 x2 − 0.08768311 x + 1.96982981 |
| 6.5% < Cu ≤ 7.5% | y = 0.00000027 x4 − 0.00004506 x3 + 0.00245191 x2 − 0.05526267 x + 1.75554360 |
| 7.5% < Cu ≤ 8.5% | y = 0.00000027 x4 − 0.00004406 x3 + 0.00240775 x2 − 0.05474153 x + 1.77586511 |
| 8.5% < Cu ≤ 9.5% | y = 0.00000012 x4 − 0.00002592 x3 + 0.00156151 x2 − 0.03786456 x + 1.67380321 |
| 10.5% < Cu ≤ 11.5% | y = −0.00000052 x4 + 0.00005229 x3 − 0.00191969 x2 + 0.02965533 x + 1.21335787 |
| 11.5% < Cu ≤ 12.5% | y = −0.00000038 x4 + 0.00003585 x3 − 0.00123786 x2 + 0.01692360 x + 1.32322464 |
| 12.5% < Cu ≤ 13.5% | y = −0.00000042 x4 + 0.00004404 x3 − 0.00172044 x2 + 0.02841565 x + 1.24656769 |
| 13.5% < Cu ≤ 14.5% | y = −0.00000014 x4 + 0.00000947 x3 − 0.00016487 x2 − 0.00253086 x + 1.49539433 |
| 14.5% < Cu ≤ 15.5% | y = −0.00000096 x4 + 0.00011425 x3 − 0.00507021 x2 + 0.09730729 x + 0.76978224 |
| 15.5% < Cu ≤ 16.5% | y = 0.00000007 x4 − 0.00001715 x3 + 0.00109352 x2 − 0.02884912 x + 1.73506674. |

5. The composite filter device according to claim 2, further comprising a second metal film that is stacked on the first metal film and has a lower electrical resistance than the first metal film.

6. The composite filter device according to claim 5, wherein the second metal film is made of an alloy including Al or Au as a main component.

7. The composite filter device according to claim 2, wherein the first metal film is made of an alloy including Mo and Nb as main components.

8. The composite filter device according to claim 1, wherein f1' is located outside the second pass band.

9. The composite filter device according to claim 1, wherein
f1<f1'<f2 is satisfied, where f1 is a center frequency of the first pass band.

10. The composite filter device according to claim 1, wherein
f1<f2<f1' is satisfied, where f1 is a center frequency of the first pass band.

11. The composite filter device according to claim 1, wherein
the first band pass filter includes a ladder filter that is connected to the antenna common terminal.

12. The composite filter device according to claim 1, wherein
the ladder filter includes a plurality of series arm resonators; and
a series arm resonator that is closest to the antenna common terminal among the plurality of series arm resonators is the elastic wave resonator.

13. The composite filter device according to claim 11, wherein the first band pass filter includes a longitudinally coupled resonator elastic wave filter that is connected to a side of the ladder filter on an opposite side from the antenna common terminal.

14. The composite filter device according to claim 1, wherein the dielectric film is made only of a silicon oxide.

15. A high-frequency front end circuit comprising:
the composite filter device according to claim 1; and
at least one out of a switch, a power amplifier, an LNA, a diplexer, a circulator, and an isolator.

16. The high-frequency front end circuit according to claim 15, wherein f1' is located outside the second pass band.

17. The high-frequency front end circuit according to claim 15, wherein f1<f1'<f2 is satisfied, where f1 is a center frequency of the first pass band.

18. The high-frequency front end circuit according to claim 15, wherein f1<f2<f1' is satisfied, where f1 is a center frequency of the first pass band.

19. The high-frequency front end circuit according to claim 15, wherein the first band pass filter includes a ladder filter that is connected to the antenna common terminal.

20. A communication device comprising:
the high-frequency front end circuit according to claim 15;
a radio frequency integrated circuit; and
a base band integrated circuit.

* * * * *